(12) United States Patent
Ishida et al.

(10) Patent No.: US 7,016,234 B2
(45) Date of Patent: Mar. 21, 2006

(54) STORAGE DEVICE

(75) Inventors: Minoru Ishida, Tokyo (JP); Katsuhisa Aratani, Chiba (JP); Akira Kouchiyama, Kanagawa (JP); Tomohito Tsushima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/883,922

(22) Filed: Jul. 2, 2004

(65) Prior Publication Data

US 2005/0035373 A1 Feb. 17, 2005

(30) Foreign Application Priority Data

Jul. 4, 2003 (JP) ............................ P2003-192262

(51) Int. Cl.
*G11C 7/00* (2006.01)

(52) U.S. Cl. ................................ 365/189.01; 365/218

(58) Field of Classification Search .................. 365/46, 365/71, 100, 148, 158, 171, 173, 185.29, 365/189.01, 218

See application file for complete search history.

(56) References Cited

U.S. PATENT DOCUMENTS

| 6,487,109 | B1 * | 11/2002 | Thewes et al. | ............. 365/173 |
| 6,625,057 | B1 * | 9/2003 | Iwata | .......................... 365/158 |
| 6,853,580 | B1 * | 2/2005 | Nishimura | ................... 365/158 |
| 6,930,909 | B1 * | 8/2005 | Moore et al. | ............... 365/158 |

FOREIGN PATENT DOCUMENTS

| JP | 2002-536840 | 10/2002 |
| WO | WO 00/48196 | 8/2000 |

* cited by examiner

*Primary Examiner*—Trong Phan
(74) *Attorney, Agent, or Firm*—Bell, Boyd & Lloyd LLC

(57) ABSTRACT

A storage device is provided. The storage device includes a number of storage cells arranged and each having a storage element and an active element including a MOS transistor that controls access to the storage element, and in which applying a voltage to the storage element the resistance value of the storage element changes and information is recorded wherein the resistance value of a storage element after information has been written is prevented from becoming lower than necessary and in which information writing can be easily performed.

14 Claims, 12 Drawing Sheets

Voltage Applied to Access Transistor and Storage Element (V)

STORAGE DEVICE

CROSS REFERENCES TO RELATED APPLICATIONS

This application claims priority to Japanese Patent Application No. P2003-192262 filed on Jul. 4, 2003, the disclosure of which is incorporated by reference herein.

BACKGROUND OF THE INVENTION

The present invention generally relates to a storage device.

In recent years storage elements have been disclosed in which, by applying a voltage across for example two opposing electrodes to cause ionization of the metal material at the surface or in the interior of one of the electrodes, and causing the ions thus created to be diffused in the direction of the opposing electrode, the resistance value across the two electrodes becomes a resistance value different from the resistance value prior to the application of voltage, so that information with two or more values can be recorded by means of such changes in resistance values (see Publication of the Japanese translation of the PCT application 2002-536840).

The specific structure of such a storage element is shown in FIG. 1. FIG. 1 is an enlarged cross-sectional view of a storage element.

The storage element 35 has a structure in which an intra-electrode material layer 33 is enclosed between, for example, two electrodes (a first electrode 31 and a second electrode 32).

In a storage element 35 with such a structure, by for example using an ionic conductor as the intra-electrode material layer 33, and in addition by making one of the two electrodes 31, 32 (for example, the first electrode 31) include a metal which diffuses as an ion during ionic conduction, when a voltage is applied across the two electrodes 31, 32 of the storage element 35 electric charge is supplied to the intra-electrode material layer 33, and as a result of diffusion as ions of the metal included in the electrode 31 into the intra-electrode material layer 33 composed of the ionic conductor, the resistance, capacitance and other electrical characteristics of the ionic conductor change, and information storage operation is possible.

In FIG. 1, a storage element 35 is shown with a structure in which the intra-electrode material layer (ionic conductor) 33 alone is enclosed between the first electrode 31 and second electrode 32; however, a storage element may also have a structure, not shown, in which for example an intra-electrode material layer (ionic conductor) and a barrier layer are enclosed between a first electrode and second electrode.

Next, operation of recording information in such a storage element is explained in detail.

A recording operation in which the resistance value of the storage element is changed from a high state to a low state is defined as information "writing", and an operation in which the resistance value of the storage element is changed from a low state to a high state is defined as information "erasure".

The resistance value of a storage element in a state in which information has not been written shall be assumed to be in the high-resistance state.

First, when writing information, for example a voltage equal to or above a certain threshold value is applied to for example the first electrode 31 of the storage element 35.

When a voltage equal to or above a threshold value is applied to the first electrode 31 in this way, the metal included in the first electrode 31 and which is electrochemically active diffuses as cations into the intra-electrode material layer 33. Then, the cations diffused into the intra-electrode material layer accept electrons from the second electrode 32 and are precipitated, to form an electrical precipitate (electronic conduction path). Accordingly, the resistance value of the intra-electrode material layer 33 between the first electrode 31 and the second electrode 32 enters a low-resistance state. That is, the state in which information has been written to the storage element 30 is entered.

On the other hand, when erasing previously written information a voltage is applied to the second electrode 32 such that the electrical precipitate which had been formed in the intra-electrode material layer 33 as described above is dissolved.

When such a voltage is applied to the second electrode 32, the electrical precipitate formed in the intra-electrode material layer 33 is dissolved and disappeared, and the resistance value of the intra-electrode material layer 33 between the first electrode 31 and the second electrode 32 returns to its original high resistance value. That is, the information previously written to the storage element 35 is erased.

By means of such changes in resistance value, operations of writing information in the storage element 35 are performed.

However, when the above-described storage element is for example used to constitute a storage device, problems such as those described below are anticipated to occur.

First the configuration of a conventional storage device (for example DRAM) is explained in conjunction with FIG. 2, and then the reasons for the anticipated occurrence of problems are explained in detail.

In a conventional storage device (for example DRAM) 41, as shown in FIG. 2, a plurality of storage cells 42 are arranged in the column direction (vertical direction) and in the row direction (horizontal direction), to form a storage cell array 43. A storage element 45 is provided in each storage cell 42.

In such a storage device 41, in order to select an arbitrary storage cell 42 from the storage cell array 43 and perform recording to or reading from the storage element 45 of that storage cell 42, for example bit lines B to select an arbitrary column of the storage cell array 43, and word lines W to select an arbitrary row, are provided.

In addition, active elements (access transistors) 46 composed for example of a MOS transistor to control accessing of storage elements 45, and power supply lines 44 to supply a power supply voltage and ground voltage to storage elements 45, are provided.

The bit lines B are for example also so-called data lines when recording information in or reading recorded information from storage elements 45; the word lines W are for example also so-called control lines to put access transistors into the ON state or to the OFF state.

In a storage device 41 with such a configuration, information is recorded in a storage element 45 only when for example a control voltage is applied to the word line W connected to the gate G of the access transistor, and the access transistor 46 is put into the ON state.

When for example information is to be recorded to a storage element 45, by executing control through the access transistor 46, voltage, current and similar are supplied to the storage element 45.

When a plurality of storage elements 35 having a structure as shown in FIG. 1 are used to constitute such a storage device 41, and an operation of recording information in an arbitrary storage element 35 is performed similarly to the operation described above, the access transistor 46 provided together with the storage element 35 in a storage cell 42 becomes large.

That is, in the storage element 35 shown in FIG. 1 the resistance value after the performance of information writing becomes a low resistance value of approximately 200 Ω, and the threshold value for the voltage applied to a storage element 35 when erasing previously written information is several hundred millivolts (for example, approximately 200 mV to 300 mV) (see the above Publication of the Japanese translation of the PCT application 2002-536840).

Hence in the storage device 41, when performing erasure in the storage element 35 of an arbitrary storage cell 42 under such conditions, a voltage equal to or greater than the threshold value of the storage element 35 (200 mV) is applied, so that it is necessary to pass a current of 1.0 mA or greater through the access transistor for supply to the storage element 35.

According to the "roadmap" of the ITRS (International Technology Roadmap for Semiconductors), which indicates various characteristics of conventional transistors arranged by year, in the interval from 2001 to 2006, for example, reductions in the design rule of semiconductor devices will advance from the 130 nm generation to the 70 nm generation; however the power supply voltages used will be constant at approximately 1.0 V, while current capacities are expected to be constant at approximately 600 $\mu$A per micrometer of channel width.

Hence when for example a power supply voltage of 1.2 V and transistors with design rule in the 130 nm generation (MOS transistors) are used in the storage device 41, in order to supply a current equal to or exceeding 1 mA to a storage element 35 through an access transistor 46 when erasing previously written information, according to the ITRS roadmap it is necessary to provide a transistor with a channel width of approximately 1.7 $\mu$m in each storage cell 42.

In such a case the area of a storage cell 42 becomes far larger than for example that of a DRAM storage cell designed with the same design rule.

However, inventors of the present invention used a writing method using voltage pulses which is capable of writing information in shorter amounts of time than the writing method by voltage sweeping disclosed in the above publication, to write information to both the storage element 35 disclosed in the above publication the cross-section of the intra-electrode material layer 33 of which has a diameter of 4 $\mu$m and to a storage element the cross-section of the intra-electrode material layer of which has a diameter of 0.5 $\mu$m as a comparative example, and the state of the resistance value of the storage element after the information writing was performed was investigated.

As a result of investigating in this way the state of the resistance value of a storage element after information writing using a voltage pulse writing method, and more specifically under the conditions of for example an applied voltage of 1.0 V and writing time of 100 msec, the resistance value of the storage element after writing was performed was 2.0 kΩ in both the storage elements. That is, those inventors discovered that the resistance value of a storage element after information writing is performed does not depend on the cross-sectional diameter of the intra-electrode material layer.

Accordingly with the storage element structure disclosed in the above publication, for example, and under the writing conditions disclosed, even if writing is performed to a storage element of smaller design than the case in which the cross-sectional diameter of the disclosed intra-electrode material layer is 4 $\mu$m, because as described above the resistance value of the storage element after writing does not depend on the cross-sectional size of the intra-electrode material layer, the resistance value of the storage element after writing remains the same value as the resistance value (200 Ω) of a storage element of diameter 4 $\mu$m, as disclosed in the above publication.

Further, in the above publication an electron conduction path is disclosed which, as an electron conduction path formed for example by the performance of information writing, has a considerably small area of cross-section.

This fact corroborates the fact discovered by the inventors that the resistance value of a storage element after information writing does not depend on the cross-sectional area of the intra-electrode material layer, and also the fact that, for the storage element structure disclosed in the above publication, under the disclosed writing conditions, even when the cross-sectional size of the disclosed intra-electrode material layer is of diameter 4 $\mu$m, and even when information is written to a more finely designed storage element, it is reasonable that the resistance value remain at 200 Ω.

Thus even when for example the storage device 41 is decreased in size, the resistance value of the storage elements 35 to which information has been written remains at the low resistance value of 200 Ω; hence as described above, in order to supply a current of 1 mA or greater to a storage element 35 through an access transistor 46, the need arises to provide a large access transistor in each storage cell 42.

In such a case also, as described above, the area of the storage cell 42 becomes much larger than that of for example a DRAM storage cell designed with the same design rule.

Thus in the storage device 41 it is necessary to supply a large current when the resistance value of a storage element 35 after information has been written is low, and the written information cannot easily be erased.

On the other hand, in order to facilitate erasure of previously written information, the resistance value of a storage element 35 to which information has been written can be increased.

However, when the resistance value of a storage element 35 to which writing has been performed is high, an operation of for example reading the written information is delayed.

This is true for all storage devices when operations of recording information are performed by changing the resistance value of a storage element 35.

Below, the reason for such a lengthening of the time required for reading information is explained, together with the configuration of the read circuit shown in FIG. 3 and actual reading operation.

As explained below, the read circuit shown in FIG. 3 is a certain case with the minimum circuit configuration necessary when information written to a storage element 35 in for example the storage device 41 shown in FIG. 2 is read as either a data "00" or a data "01".

The read circuit 60 includes, for example, transistors for control (switching transistors) 61, 611 provided near the entrance, load circuits 62, 621 which convert the current flowing in a bit line B (cell current) into a voltage, and a sense amplifier 63 to detect information written to the storage elements 35, 351 of each storage cell 42, 421, connected by wiring, where the information is written to the storage elements 35, 351 by executing control through access transistors 46, 461.

The storage cell 421 provided on the right side in the drawing is a so-called reference cell used to compare the states of cell currents flowing in the bit lines B when reading information which has been written to the storage element 35 of the storage cell 42 provided on the left side in the drawing.

Other portions are similar to those in the storage device 41 shown in FIG. 2, and so the same symbols are assigned to corresponding portions.

Here the storage element 35 is assumed to be configured such that when for example writing information, by controlling the writing conditions, the low-resistance state can be created in an intermediate stage of the resistance change.

That is, it is assumed that when the resistance value of a storage element 35 to which information has not been written is for example 100 k$\Omega$, by controlling the write conditions, a low-resistance state of for example 50 k$\Omega$, 20 k$\Omega$, or 10 k$\Omega$ can be created.

In the state in which the 100 k$\Omega$ storage element 35 holds the data "00", the resistance value at this time is taken to be Rmhigh; in the state in which the 50 k$\Omega$ storage element 35 holds the data "01", the resistance value at this time is taken to be Rmlow1; in the state in which the 20 k$\Omega$ storage element 35 holds the data "10", the resistance value at this time is taken to be Rmlow2; and in the state in which the 10 k$\Omega$ storage element 35 holds the data "11", the resistance value at this time is taken to be Rmlow3.

Thus in such a storage element 35 with a structure enabling the creation of low-resistance states at intermediate stages of resistance change, a single storage element 35 can hold two bits of data.

Here a read operation is considered for the state in which the data "00" is held, that is, when the storage element 35 is in the high-resistance state Rmhigh.

In the read circuit 60 for example, the current flowing in the bit line B from the power supply line 44 passing through the storage element 35 (the cell current) is detected to be "extremely small" or "zero" by the sense amplifier 63.

Hence by performing a read operation, if the current flowing in the bit line B is regarded as "extremely small" or "zero", then the storage element 35 is judged to be in the high-resistance state, as described above.

Thus reading of the state in which data "00" is held is comparatively simple, and there is little possibility of erroneous reading of for example data other than the data "00".

However, when a storage element 35 is in a state of holding data "01" (that is, when the resistance value of the storage element 35 is changed from high resistance to a low resistance), in order to read the data held, the magnitude of the current (cell current) flowing in the bit line B from the power supply line 44 through the storage element 35 is judged to be greater than or smaller than the current in the above-described state of holding data "00".

Alternatively, for purposes of contrast, a judgment can be made as to whether the above cell current is equal to, for example, the current (cell current) flowing in the bit line B from the power supply line 44 through the storage element 351 of a reference cell 421 to which data "01" has been written.

In order to make the judgment accurately, it is necessary to wait for a certain length of time before detecting the change in current in bit line B, or before detecting the change in voltage when for example current/voltage conversion is performed in the load circuit 621.

In the storage element 35, when, although the resistance is lower than the state in which for example the data "00" is held, the absolute magnitude of the low resistance is high, it is difficult to perform the detection rapidly.

This is attributed to the fact that when the resistance value is high the current flowing in the bit line B through the storage element 35 is small, so that the parasitic capacitance associated with the bit line B is not charged rapidly, and as a result there is a large delay in the change in potential of the bit line B.

In other words, the cause is that the time constant is large, so that there is a large delay in the change in potential of the bit line B.

In addition, when a storage device is considered in which information with more than two values can be recorded, with, for example, a state in which the resistance is still lower than the state in which data "01" is held as a state of holding data "10" (binary), and a state in which the resistance is still lower than this as a state of holding data "11" (binary), while there is little possibility of erroneous reading as a state of holding other than data "00" when the resistance is at the highest value, that is, when data "00" is held, in the state with second-highest resistance, that is when data "01" is held, due to the delay in potential change in the bit line there is the greatest difficulty in rapidly judging the data value.

Thus in the storage device 41, when the resistance value of a storage element 35 after writing of information is high, the time required when reading the information written to the storage element 35 becomes long.

SUMMARY OF THE INVENTION

The present invention in an embodiment provides a storage device, in which are arranged a plurality of storage cells each having a storage element and an active element composed of a MOS transistor which controls access to the storage element and by applying a voltage to a storage element the resistance value of the storage element changes to record information; configured such that, when recording operation to change the resistance value of a storage element from a high state to a low state is defined as information writing, and recording operation to change the resistance value of a storage element from a low state to a high state is defined as information erasure, if when erasing previously written information the voltage applied to the storage cell is Ve and the voltage applied to the gate of the active element is Vg, the minimum voltage necessary when erasing information is Vt, and the drain current flowing in the active element for a voltage V across the source and drain of the active element is represented by the function $\{I(Vg,V)\}$, then the resistance value R of the storage element after information has been written satisfies the relation $R \geq Vt/\{I(Vg, Ve-Vt)\}$.

The present invention provides in an embodiment a storage device in which the resistance value of a storage element after information is recorded can be prevented from falling lower than necessary, and in which information recording operations can be easily performed.

Further, the present invention provides in an embodiment a storage device in which the resistance value of a storage element after information is recorded can be prevented from rising higher than necessary, and in which information recording operations can be performed at high speed.

According to the above-described storage device in an embodiment of the present invention, if when performing erasure of previously written information the voltage applied to the storage cell is Ve, the voltage applied to the gate of the active element is Vg, the minimum voltage necessary when erasing information is Vt, and the drain current flowing in the active element for a voltage V across the source and drain of the active element is represented by the function $\{I(Vg,V)\}$, then the resistance value R of the storage element after information has been written satisfies the relation $R \geq Vt/\{I(Vg,Ve-Vt)\}$, so that the resistance value of a storage element after the writing of information can be prevented from becoming lower than is necessary.

Accordingly, when erasing previously written information, there is no longer a need to supply a large current to a storage element through the active element.

Further, the present invention in an embodiment provides a storage device, in which are arranged a plurality of storage cells each having a storage element and an active element composed of a MOS transistor which controls access to the storage element and by applying a voltage to a storage element the resistance value of the storage element changes to record information; configured such that, when recording operation to change the resistance value of a storage element from a high state to a low state is defined as information writing, and recording operation to change the resistance value of a storage element from a low state to a high state is defined as information erasure, then the resistance value R of a storage element after information is written satisfies the relation $R \geq 1.7$ k$\Omega$.

According to the above-described storage device in an embodiment of the present invention, because the resistance value R of a storage element after the writing of information satisfies the relation $R \geq 1.7$ k$\Omega$, the resistance value of a storage element after the writing of information can be prevented from being lower than necessary.

Accordingly, when erasing previously written information, there is no longer a need to supply a large current to a storage element through the active element.

Further, the present invention in an embodiment provides a storage device, in which are arranged a plurality of storage cells each having a storage element and an active element composed of a MOS transistor which controls access to the storage element and by applying a voltage to a storage element the resistance value of the storage element changes to record information; configured such that, when recording operation to change the resistance value of a storage element from a high state to a low state is defined as information writing, if when writing information the voltage applied to the storage cell is Vw (V) and the time over which the voltage is applied to the storage cell is Tw (sec), when erasing previously written information the voltage applied to the storage cell is Ve (V), the voltage applied to the gate of the active element is Vg (V) and the minimum voltage necessary when erasing information is Vt (V), and if with the active element in the ON state the drain current flowing in the active element for a voltage V across the source and drain of the active element is represented by the function $\{I(Vg,V)\}$, then the relation $10^{\{-0.275 \cdot log(Tw)+3.175-0.15 \cdot (Vw)\}} \geq t/\{I(Vg,Ve-Vt)\}$ is satisfied.

According to the above-described storage device in an embodiment of the present invention, if when performing information writing the voltage applied to the storage cell is Vw (V) and the time over which the voltage is applied to the storage cell is Tw (sec), when erasing previously written information the voltage applied to the storage cell is Ve (V), the voltage applied to the gate of the active element is Vg (V), and the minimum voltage necessary when erasing information is Vt (V), and if with the active element in the ON state the drain current flowing in the active element for a voltage V across the source and drain of the active element is represented by the function $\{I(Vg,V)\}$, then because the relation $10^{\{-0.275 \cdot log(Tw)+3.175-0.15 \cdot (Vw)\}} \geq Vt/\{I(Vg,Ve-Vt)\}$ is satisfied, the voltage Vw applied to a storage cell when writing information, the time over which the voltage Vw is applied to the storage cell, and similar can be provided such that the resistance value of the storage cell after information has been written does not become lower than is necessary.

Further, when erasing previously written information, there is no longer a need to supply a large current to the storage element through the active element.

Further, the present invention provides in an embodiment a storage device in which are arranged a plurality of storage cells each having a storage element and an active element composed of a MOS transistor which controls access to the storage element and by applying a voltage to a storage element the resistance value of the storage element changes to record information; configured such that, when recording operation to change the resistance value of a storage element from a high state to a low state is defined as information writing, and when recording operation to change the resistance value of a storage element from a low state to a high state is defined as information erasure, if when writing information the voltage applied to a storage cell is Vw (V) and the time over which the voltage is applied to the storage cell is Tw (sec), then the relation $10^{\{-0.275 \cdot log(Tw)+3.175-0.15 \cdot (Vw)\}} \geq 1700$ is satisfied.

According to the above-described storage device in an embodiment of the present invention, if when writing information the voltage applied to the storage cell is Vw (V) and the time over which the voltage is applied to the storage cell is Tw (sec), then because the relation $10^{\{-0.275 \cdot log(Tw)+3.175-0.15 \cdot (Vw)\}} \geq 1700$ is satisfied, the voltage Vw applied to a storage cell or the time Tw over which the voltage Vw is applied to the storage cell when writing information, or similar, can be provided such that for example the resistance value of the storage cell after information is written is lower than 1700 (1.7 k$\Omega$).

Further, when erasing previously written information, there is no longer a need to supply a large current to the storage element through the active element.

Further, the present invention provides in am embodiment a storage device, in which are arranged a plurality of storage cells each having a storage element and an active element composed of a MOS transistor which controls access to the storage element, by applying a voltage to a storage element the resistance value of the storage element changes to record information, and a load circuit which is used when information is read from storage elements is included; configured such that, when recording operation to change the resistance value of a storage element from a high state to a low state is defined as information writing, and when recording operation to change the resistance value of a storage element from a low state to a high state is defined as information erasure, if the resistance value of a storage element after information has been written is R and the resistance value of the load circuit is Rlo, then the relation $R+Rlo \leq 250$ k$\Omega$ is satisfied.

According to the above-described storage device in an embodiment of the present invention, if the resistance value of a storage element after information is written is R and the resistance value of the load circuit is Rlo, then because the relation $R+Rlo \leq 250$ k$\Omega$ is satisfied, the resistance value of a storage element after information writing is performed does not become higher than necessary. In this way, delays during reading can be suppressed.

Further, the present invention in an embodiment provides a storage device in which are arranged a plurality of storage cells each having a storage element and an active element composed of a MOS transistor which controls access to the storage element and by applying a voltage to a storage element the resistance value of the storage element changes to record information; configured such that, when recording operation to change the resistance value of a storage element from a high state to a low state is defined as information writing, and when recording operation to change the resistance value of a storage element from a low state to a high state is defined as information erasure, then the resistance value R of a storage element after information is written satisfies the relation $R \leq 125$ k$\Omega$.

According to the above-described storage device in an embodiment of the present invention, because the resistance value R of a storage element after the writing of information satisfies the relation $R \leq 125$ k$\Omega$, the resistance value of a storage element after the writing of information does not become higher than necessary. In this way, delays during reading can be suppressed.

Further, the present invention provides in an embodiment a storage device in which are arranged a plurality of storage cells each having a storage element and an active element composed of a MOS transistor which controls access to the storage element and by applying a voltage to a storage element the resistance value of the storage element changes to record information; configured such that, when recording operation to change the resistance value of a storage element from a high state to a low state is defined as information writing, and when recording operation to change the resistance value of a storage element from a low state to a high state is defined as information erasure, if when writing information the voltage applied to a storage cell is Vw (V) and the time over which the voltage is applied to the storage cell is Tw (sec), then the relation $10^{\{-0.275 \cdot log(Tw) + 3.175 - 0.15 \cdot (Vw)\}} \leq 125000$ is satisfied.

According to the above-described storage device of the present invention in an embodiment, if when writing information the voltage applied to the storage cell is Vw (V) and the time over which the voltage is applied to the storage cell is Tw (sec), then because the relation $10^{\{-0.275 \cdot log(Tw) + 3.175 - 0.15 \cdot (Vw)\}} \leq 125000$ is satisfied, the voltage Vw applied to a storage cell orthe time Tw over which the voltage Vw is applied to the storage cell when writing information, or similar, can be provided such that for example the resistance value of the storage cell after information is written does not rise much higher than 125000 (125 k$\Omega$).

Further, the resistance value of a storage element after information has been written can be prevented from rising higher than is necessary, and delays when reading information can be suppressed.

Further, the present invention in an embodiment relates to a storage device in which are arranged a plurality of storage cells each having a storage element and an active element composed of a MOS transistor which controls access to the storage element and by applying a voltage to a storage element the resistance value of the storage element changes to record information; configured such that, when recording operation to change the resistance value of a storage element from a high state to a low state is defined as information writing, and when recording operation to change the resistance value of a storage element from a low state to a high state is defined as information erasure, when writing information the above voltage applied to a storage cell is higher than the power supply voltage applied to peripheral circuitry other than storage cells not subjected to increases in voltage, or is higher than the standard operating voltage of the active element.

According to the above-described storage device of the present invention in an embodiment, when writing information the above voltage applied to the storage cell is higher than the power supply voltage applied to peripheral circuitry other than storage cells not subjected to increases in voltage, or is higher than the standard operating voltage of the active element, so that for example during information writing, the time required until the target resistance value is attained can be shortened.

In the storage device having above-described configuration, when information writing is performed, if the voltage applied to the storage cell is Vw, the maximum rated voltage of the active element is Vo2, and the drain current flowing in the active element is Ivo2 when the active element is in the ON state and the voltage across the source and drain of the active element is Vo2, then when a configuration is adopted such that the resistance R of the storage element after information writing is performed satisfies the relation $R \geq (Vw-Vo2)/Ivo2$, in addition to the action described above, in cases where the voltage applied to the storage element during information writing is higher than the power supply voltage applied to peripheral circuitry other than storage cells not subjected to increases in voltage, or is higher than the standard operating voltage of the active element, then breakdown of for example the active element and storage element, as well as wiring or similar connected thereto, can be prevented.

Further, in the above-described configuration, when the gate length of the active element of a storage cell is formed to be longer than the gate length of the active elements other than the storage cells, the maximum rated voltage of the active element can be increased compared with cases in which the gate length of the active element of a storage cells is shorter than the gate lengths for the active element other than the storage cells, or compared with cases in which the gate length is equal to the gate lengths of the active elements other than storage cells.

Further, in the above-described configuration, if when writing information the voltage applied to the storage cell is Vw and the standard operating voltage of the active element is Vo3, and if, with the active element in the ON state and when the voltage across the source and drain of the active element is Vo3, the drain current flowing in the active element is IVo3, then when a configuration is adopted such that the resistance value R of the storage element after information has been written satisfies the relation $R \geq (Vw-Vo3)/IVo3$, then in addition to the above-described action, when for example information is being written, if the voltage applied to the storage element is higher than the power supply voltage applied to peripheral circuitry other than storage cells not subjected to increases in voltage or is higher than the standard operating voltage of the active element, then breakdown of for example the active element and storage element, and also of wiring and similar connected thereto, can be prevented.

Further, the active element can be operated at a standard operating voltage determined at the time of design of the active element, so that for example the degradation of characteristics of the active element which occurs upon repeated use of the active element can be suppressed.

Further, in the above-described configurations, if when writing is performed the time over which the voltage is applied to the storage cell is Tw (sec), the voltage applied to a storage cell is Vw (V), the maximum rated voltage of the active element is Vo2 (V), and the drain current flowing in the active element when the active element is in the ON state and the voltage across the source and drain of the active element is Vo2 (V) is IVo2 (A), then when a configuration is employed such that the relation $10^{\{-0.275 \cdot log(Tw)+3.175-0.15 \cdot (Vw)\}} \geq (Vw-Vo2)/IVo2$ is satisfied, then in addition to the above-described action, when for example information writing is performed, if the voltage applied to the storage element is higher than the power supply voltage applied to peripheral circuitry other than storage cells not subjected to increases in voltage or is higher than the standard operating voltage of the active element, breakdown of the active element and storage element as well as wiring and similar connected thereto can be prevented, including the conditions of the voltage Vw applied to the storage cell and the time Tw over which the voltage Vw is applied to the storage cell and similar during information writing.

Further, in the above-described configurations, if when writing is performed the time over which the voltage is applied to the storage cell is Tw (sec), the voltage applied to a storage cell is Vw (V), the maximum rated voltage of the active element is Vo3 (V), and the drain current flowing in the active element when the active element is in the ON state and the voltage across the source and drain of the active element is Vo3 (V) is IVo3 (A), then when a bx;1configuration is employed such that the relation $10^{\{-0.275 \cdot log(Tw)+3.175-0.15 \cdot (Vw)\}} \geq (Vw-Vo3)/IVo3$ is satisfied, then in addition to the above-described action, when for example information writing is performed, if the voltage applied to the storage element is higher than the power supply voltage applied to peripheral circuitry other than storage cells not subjected to increases in voltage or is higher than the standard operating voltage of the active element, breakdown of the active element and storage element as well as wiring and similar connected thereto can be prevented, including the conditions of the voltage Vw applied to the storage cell and the time Tw over which the voltage Vw is applied to the storage cell and similar during information writing.

Further, the active element can be operated at a standard operating voltage determined at the time of design of the active element, so that for example the degradation of characteristics of the active element which occurs upon repeated use of the active element can be suppressed.

Pursuant to an embodiment of the present invention, a storage device is provided in which the resistance value of a storage element after information has been written is prevented from becoming lower than is necessary, and in which information writing can be performed easily.

In the storage device are arranged a plurality of storage cells each having a storage element and an active element including a MOS transistor which controls access to the storage element, and in which by applying a voltage to the storage element the resistance value of the storage element changes and information is recorded; when recording operation to change the resistance value of a storage element from a high state to a low state is defined as information writing and recording operation to change the resistance value of a storage element from a low state to a high state is defined as information erasure, if when erasing written information the voltage applied to the storage cell is Ve and the voltage applied to the gate of the active element is Vg, the minimum voltage necessary when erasing information is Vt, and the drain current flowing in the active element for a voltage V across the source and drain of the active element when the active element is in the ON state is represented by the function $\{I(Vg,V)\}$, then the resistance value R of the storage element after information has been written satisfies the relation $R \geq Vt/\{I(Vg,Ve-Vt)\}$ pursuant to an embodiment.

Additional features and advantages of the present invention are described in, and will be apparent from, the following Detailed Description of the Invention and the figures.

DETAILED DESCRIPTION OF THE INVENTION

Figure 1:
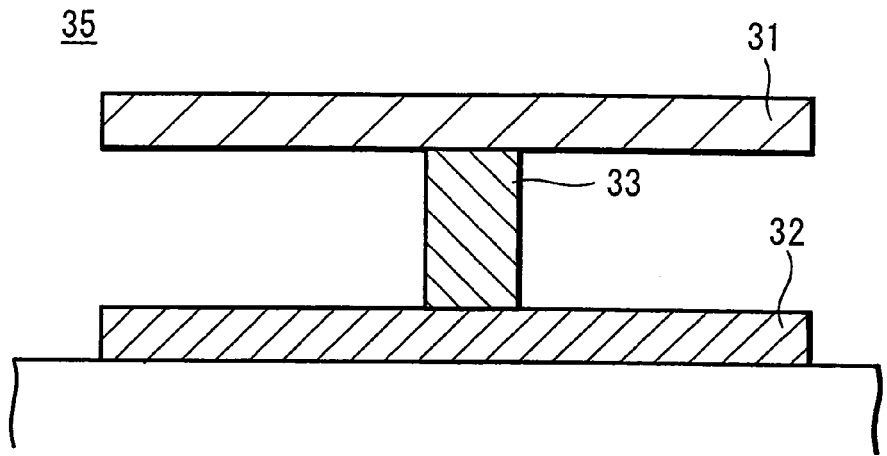
FIG. 1 is an enlarged cross-sectional view showing the configuration of a conventional storage element.
Figure 3:
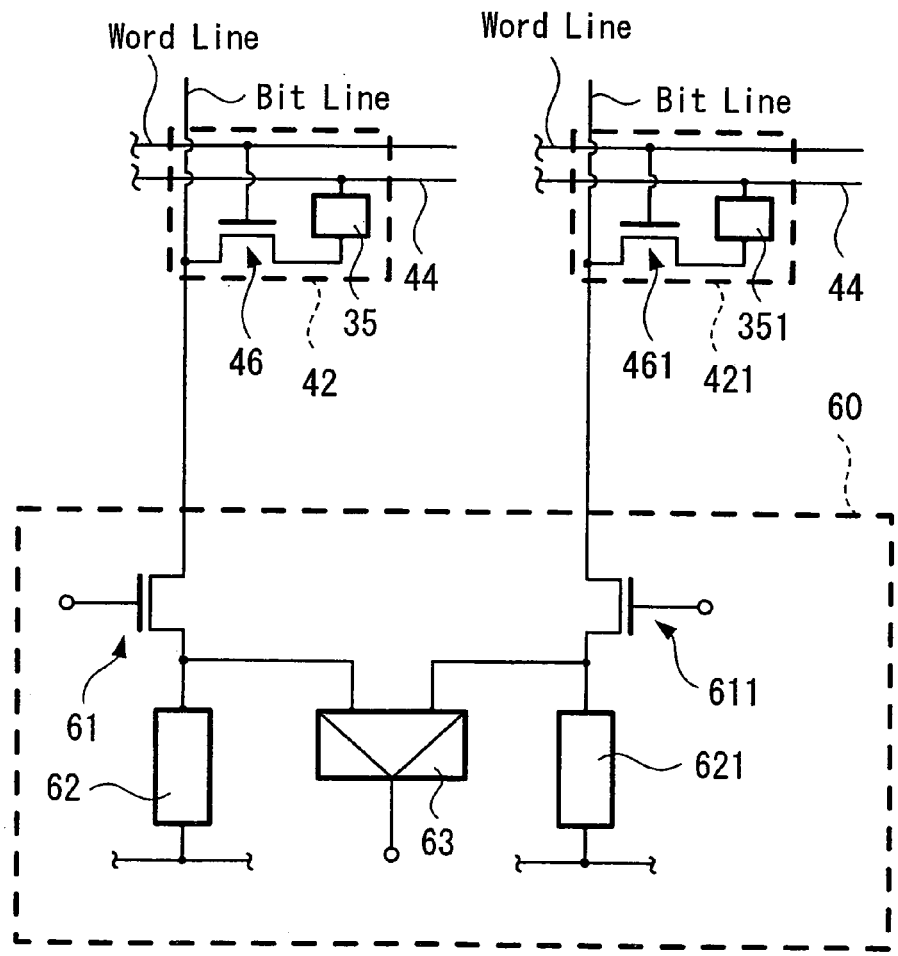
FIG. 3 shows the configuration of the read circuit of a storage device.
Figure 2:
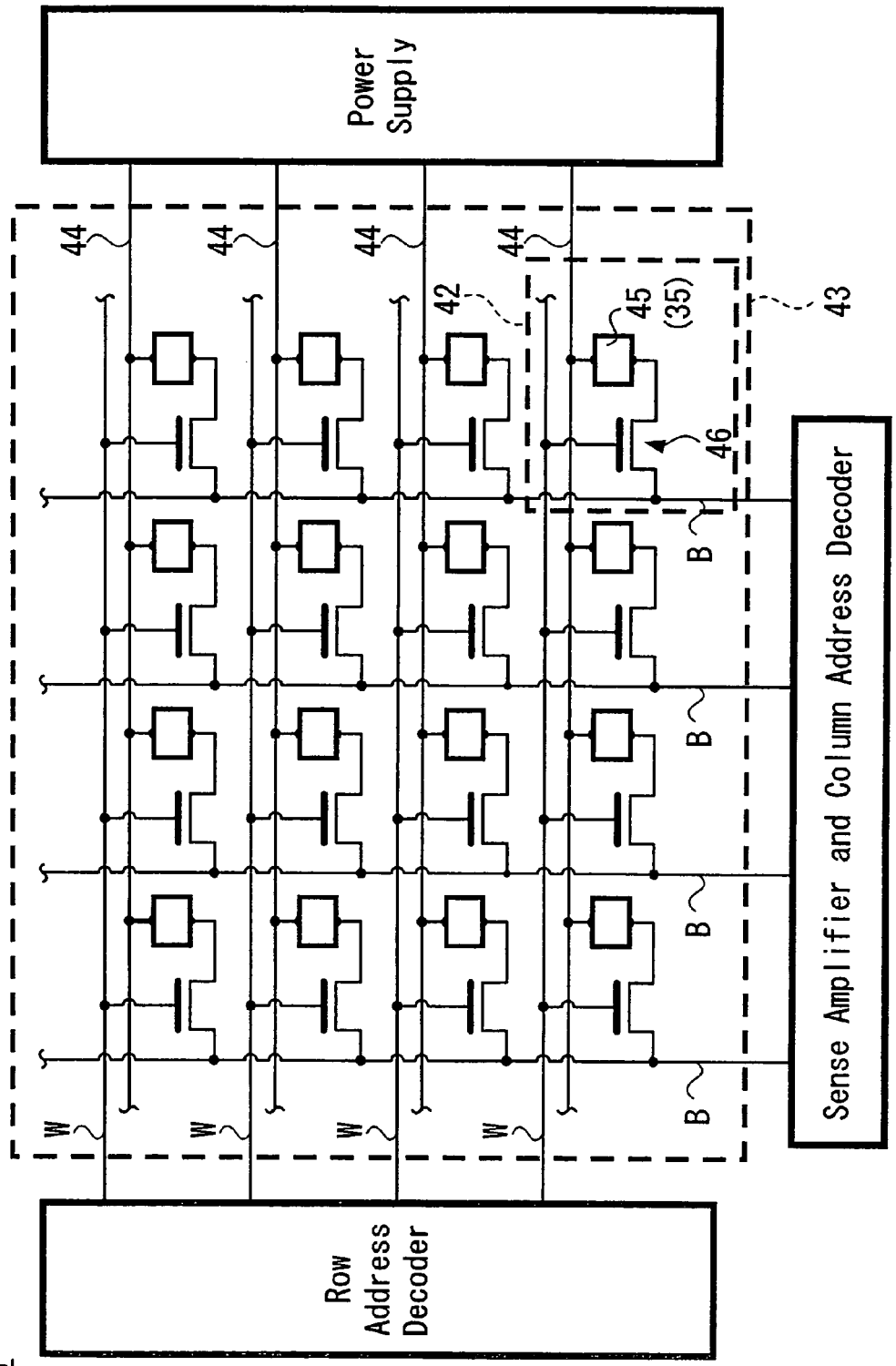
FIG. 2 is a plane view showing the circuit configuration of the storage cell array of a conventional storage device.
Figure 4:
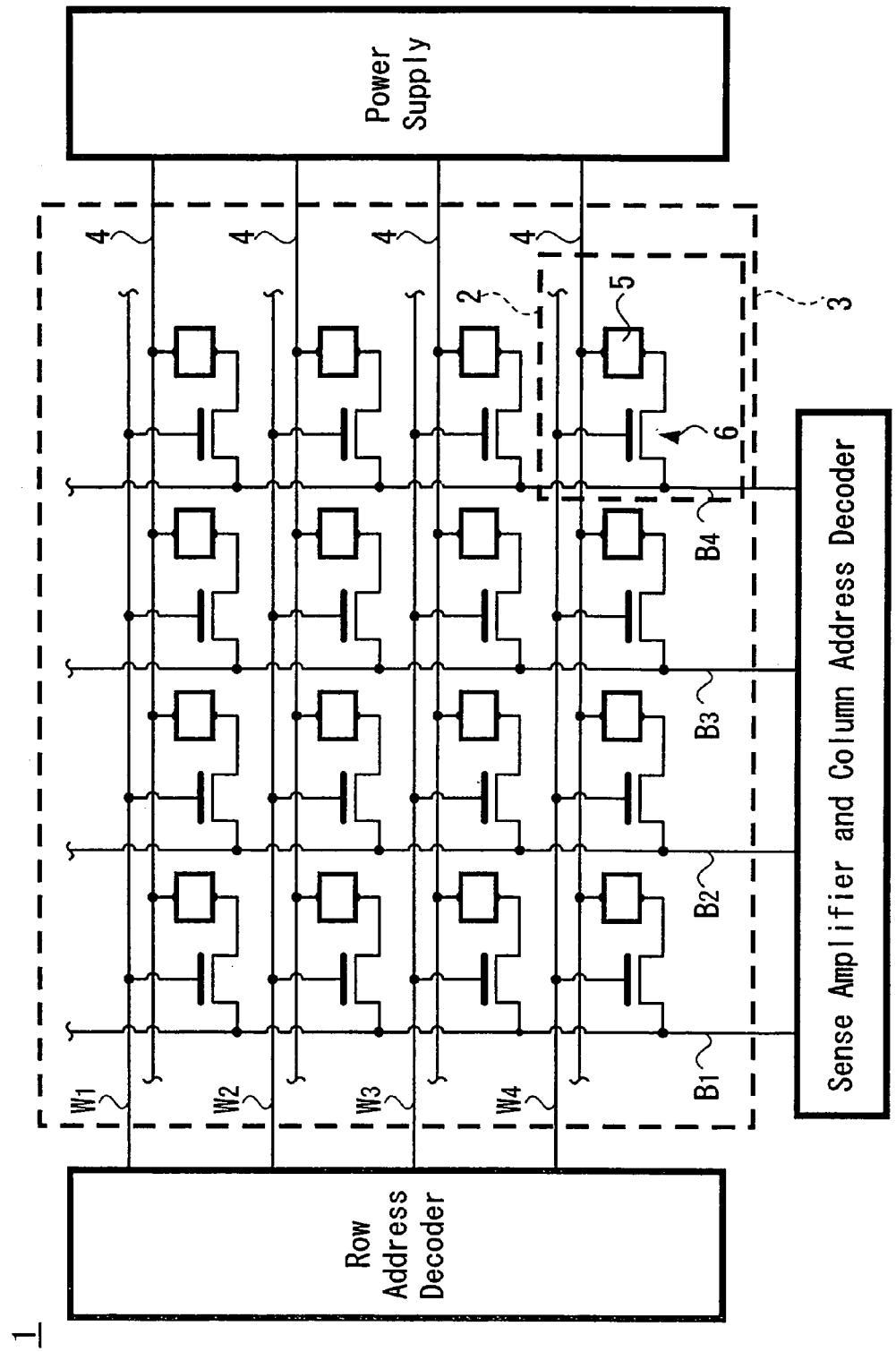
FIG. 4 is a plane view showing the circuit configuration of the storage cell array of a storage device according to an embodiment of the present invention.

The present invention generally relates to a storage device. An embodiment of a storage device of this invention is explained using FIG. 4. FIG. 4 shows (in plane view) the circuit diagram of a storage device.

In the storage device 1, a plurality of storage cells 2 are arranged near the intersections of two lines, which are bit lines B and word lines W, to constitute a storage cell array 3.

In FIG. 4, a case is shown in which four bit lines B (B1, B2, B3, and B4) are arranged at predetermined intervals in the vertical direction, and four word lines W (W1, W2, W3, and W4) are arranged at predetermined intervals in the horizontal direction. Hence due to the four vertical by four horizontal arrangement, the configuration includes an arrangement of 16 storage cells 2.

On one end of the bit lines, that is, on the outside of the storage cell array 3, are provided a sense amplifier, column address decoder, and other peripheral circuitry; on one end of the word lines, that is, on the outside of the storage cell array 3, are provided a row address decoder and other peripheral circuitry. Numerals 4 denote power supply lines, and a power supply is provided at one end of these power supply lines 4.

The column address decoder and row address decoder are provided in order to select an arbitrary storage cell 2 from the storage cell array 3 for information recording (writing and erasing) or for reading; and the sense amplifier is provided in order to read information recorded in the storage element 5 of each of the storage cells 2.

The bit lines each have both the role of selecting an arbitrary column (vertical axis) from the storage cell 3 and the role of so-called information line (data line) when writing information to or reading information from an arbitrary storage cell 2. The word lines each have both the role of selecting an arbitrary row (horizontal axis) from the storage cell array 3, and the role of so-called control line, turning on and off an access transistor, described below, which controls accessing of the storage cell 2.

Figure 5:
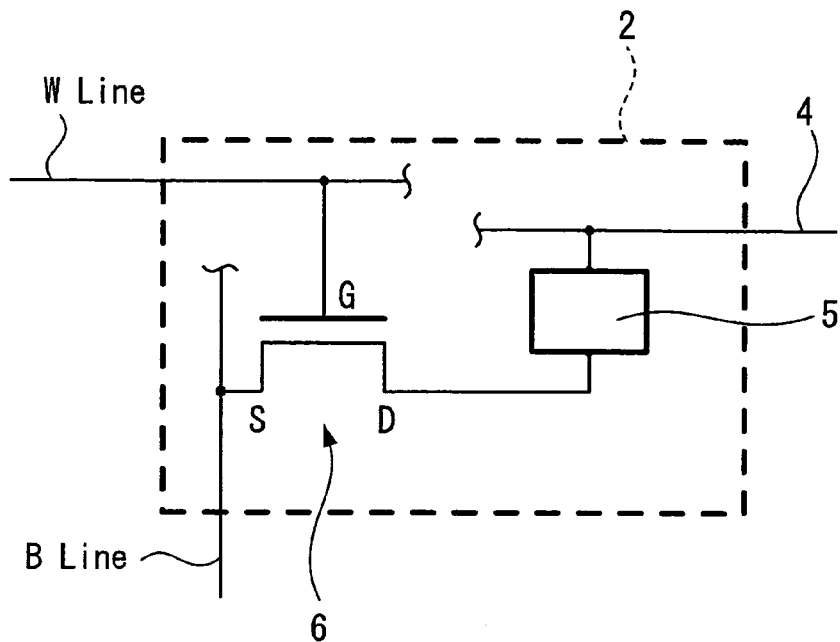
FIG. 5 is an enlarged plane view showing the circuit configuration of a storage cell constituting the storage cell array of FIG. 4.

Next, the configuration of storage cells constituting the storage cell array is explained, using FIG. 5.

FIG. 5 is an enlarged plane view of a storage cell 2 positioned near the intersection of a bit line B4 and a word line W4, among the plurality of storage cells constituting the storage cell array of the storage device shown in FIG. 4.

The storage cell 2 includes, for example, the storage element 5 and the active element 6.

As the active element 6, for example, an access transistor composed of a MOS-type transistor is used.

Figure 6:
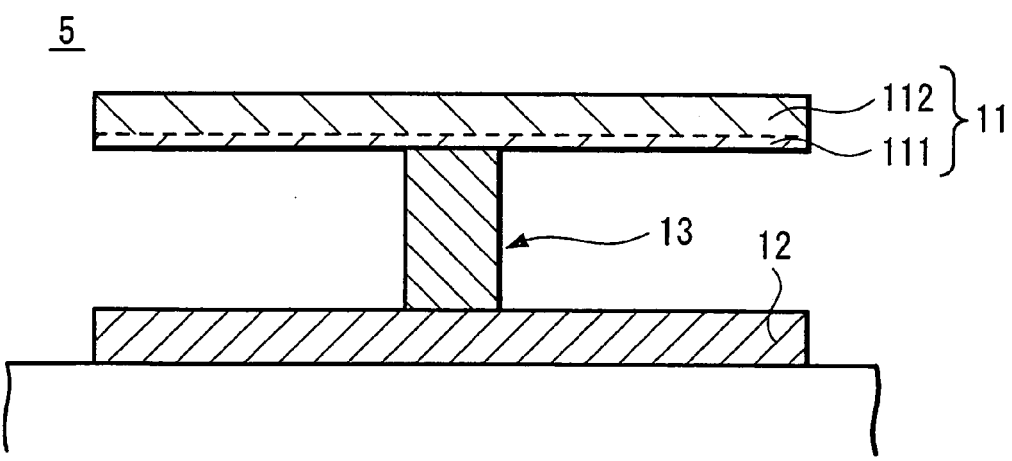
FIG. 6 is an enlarged cross-sectional view of a storage element provided in the storage cell of FIG. 5.

The storage element 5 has a structure in which the intra-electrode material layer 13 is enclosed between for example two electrodes (for example, a first electrode 11 and a second electrode 12), as shown in FIG. 6.

The first electrode 11 has a two-layer structure, in which are stacked a layer composed of an oxidation-reduction reaction activator (redox activator) (a so-called redox activator layer) 111, and a layer composed of electrode material conventionally used in semiconductor devices (a so-called electrode material layer) 112.

The redox activator layer 111 is composed for example of Ag, and the electrode material layer 112 is composed for example of TiW (titanium tungsten).

The intra-electrode material layer 13 is composed for example of GeSbTe. The intra-electrode material layer 13 is formed to a film thickness of for example 40 nm.

As a result of supply of charge to the intra-electrode material layer 13, the Ag which is the redox activator included in the first electrode 11 is oxidized to become cations, which diffuse into the intra-electrode material layer 13 in the direction of the second electrode 12 opposite to the first electrode 11, where the cations accept electrons from the second electrode 12 and are precipitated, to form an electron conduction path between the first electrode 11 and the second electrode 12, so that a state is entered in which the resistance between the first electrode 11 and second electrode 12 is low.

On the other hand, by applying a voltage in the direction opposite to this, the Ag which is the redox activator of the previously formed electron conduction path is dissolved, the electron conduction path between the first electrode 11 and second electrode 12 is disappeared, and a state is entered in which the resistance between the first electrode 11 and second electrode 12 is high.

Thus by changing the direction of the voltage applied across the first electrode 11 and second electrode 12, the state can be repeatedly changed between a high-resistance and a low-resistance state. With this construction, information can be recorded according to the state of the resistance between the first electrode 11 and second electrode 12.

In the initial state, an electron conduction path is not formed in the intra-electrode material layer 13, and so a state obtains in which the resistance between the first electrode 11 and second electrode 12 is high. The resistance of the storage element 5 also changes between a high-resistance state and a low-resistance state according to the state of the resistance between the first electrode 11 and second electrode 12.

The second electrode 12 is composed of an electrode material conventionally used in semiconductor devices, such as TiW (titanium tungsten). The second electrode 12 is formed to have a film thickness conventionally used in semiconductor devices, such as for example a film thickness of 100 nm.

In the case of FIGS. 4 and 5, the gate of the access transistor 6 is connected to the word line W by a wire. Also, either the source or the drain is connected via a wire to the bit line B, and the other is connected to for example the first electrode 11 of the storage element 5 via a wire. The second electrode 12 of the storage element 5 is connected to the power supply line 4 via a wire.

Next, operation when an arbitrary storage cell is selected from the storage cell array in a storage device of the above configuration and information is recorded (written and erased) to the storage element of this storage cell is explained.

First, the operation before the selection of an arbitrary storage cell 2 from the storage cell array 3 is explained.

As the arbitrary storage cell, operation of the storage cell 2 positioned near the intersection of bit line B4 and word line W4 is explained.

In the explanation, recording operation to change the resistance value of the storage element 1 from a high state to a low state is defined as information "writing", and recording operation to change the resistance value of the storage cell 1 from a low state to a high state is defined as "erasure".

First, in the storage cell array 3, the column is selected, to which the storage cell 2 to which information is to be written is connected, and a voltage for information writing is applied to the bit line B4 corresponding to this column.

At this time, the above-described voltage for information writing is not applied to the other bit lines (B1 to B3).

Next, the row in the storage cell 3 to which the storage cell 2 for information writing is connected is selected, and a control voltage is applied to the word line W4 corresponding to this row, such that the access transistor is turned on and information writing to the storage element 5 of the storage cell 2 is performed.

At this time, the above-described control voltage is not applied to the other word lines (W1 to W3) which do not correspond to the row for information writing, so that the access transistors 6 thereof remain in the OFF state.

Accordingly, unexpected information writing to unselected storage cells 2 is prevented, while the voltage for the desired writing is applied only to the selected storage cell 2 to perform information writing.

Next, recording operation is explained for cases in which information recording (writing and erasure) and reading of the storage element 5 is performed in an arbitrary storage cell 2 selected as described above.

When for example writing information, as described above, a voltage for writing (positive voltage) is applied to the first electrode 11 from the bit line B4 via the wiring. As a result, the Ag included in the redox activator layer 111 of the first electrode 11 is ionized and diffuses in the intra-electrode material layer 13 in the direction of the second electrode 12, and upon accepting electrons from the second electrode 12 is precipitated to form an electron conduction path between the first electrode 11 and the second electrode 12, as a result of which a state is entered in which the resistance between the first electrode 11 and second electrode 12 is low. By this means, the resistance of the storage element 5 also becomes low, so that information writing is performed.

Further, when for example performing information erasure, an erasure voltage of polarity opposite to that for writing is applied to the second electrode 12 via wiring connected to the second electrode 12.

Accordingly, the Ag forming the electron conduction path precipitated in the intra-electrode material layer 13 is again ionized and dissolved, and the above electron conduction path is disappeared. As a result there is a return to the state of high resistance between the first electrode 11 and second electrode 12, and the resistance of the storage element 5 also becomes high, so that information is erased.

In a storage device 1 in which recording operation such as that described above is performed, when for example the resistance value of the storage element 5 after information has been written becomes lower than is necessary, when erasing the written information it becomes necessary to supply a large current to the storage element 5 through the access transistor 6, as described above.

Thus if large-area access transistors 6 with wide channels are not provided in each storage cell 2 in order to supply a large current to the storage element 5, it is difficult to erase previously written information. This is because when using MOS-type transistors employed as the access transistors 6, the amount of current which can be passed in the channel is proportional to the channel width.

Hence in this embodiment, in order to prevent the resistance value of a storage element after information writing from becoming lower than is necessary, the resistance value of a storage element 5 after information writing is provided.

When stipulating the resistance value of a storage element 5 to which information has been written, an access transistor 6 of the smallest size capable of being formed with a pattern through exposure patterning in semiconductor manufacturing processes is used, and the resistance value of a storage element 5 after writing is provided such that erasure of previously written information in the storage element 5 is possible within the range of currents which can be supplied by this access transistor 6.

First, an embodiment is explained referring to FIG. 7, in which the resistance value R of the storage element after information has been written, for example the lower limit Rlow of the resistance R, is provided.

Specifically, as the resistance of a storage element 5 after information has been written, the resistance value enabling erasure of previously written information by applying the lowest possible erasure voltage is determined.

Figure 7A:
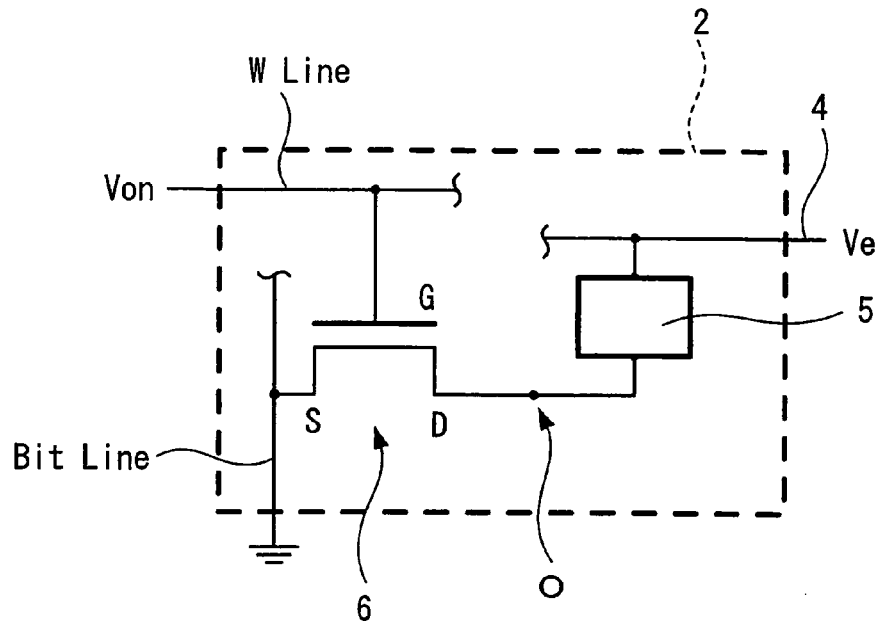
FIG. 7A is an enlarged plane view showing the state of a storage cell.
Figure 7B:
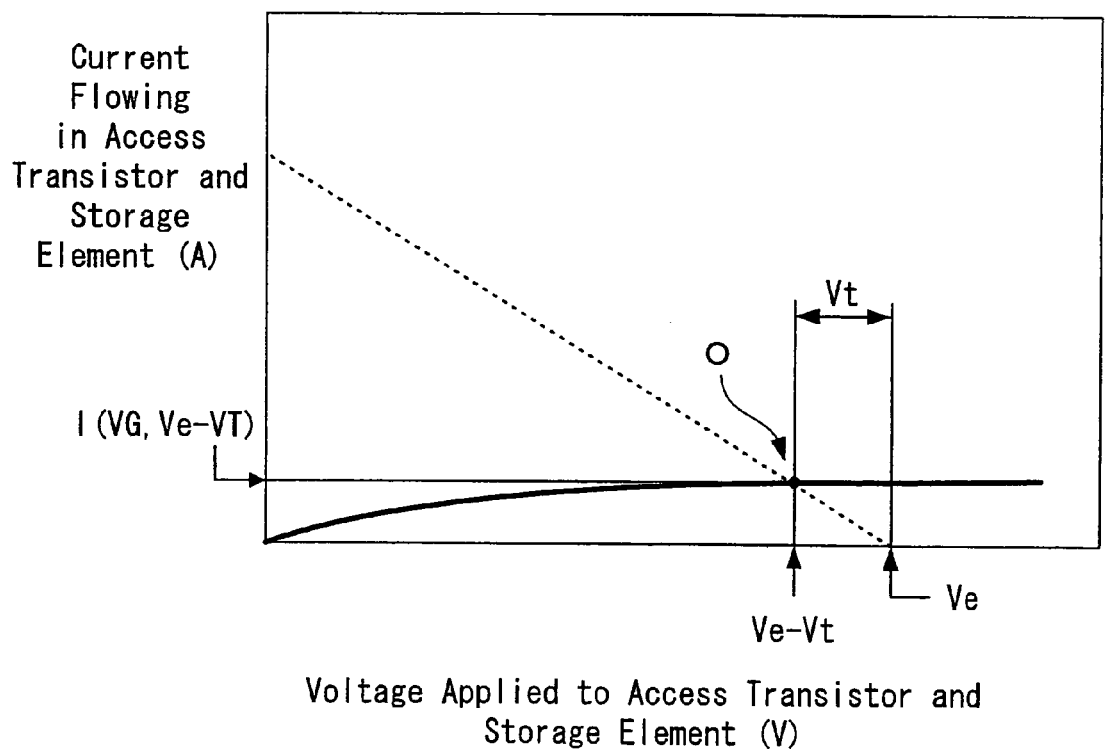
FIG. 7B is a graph showing the load characteristic of the resistance of a storage element and access transistor in the state shown in FIG. 7A.

In FIGS. 7A and 7B, the state in which a voltage Ve for erasure is applied to a storage cell 2 in which a storage element 5 and access transistor 6 are connected in series, a voltage Von (gate voltage Vg) is applied to the gate G of the access transistor 6 to turn on the access transistor 6, and the bit line B is grounded is shown in FIG. 7A, and the load characteristic of the storage element 5 and access transistor 6 in the state of FIG. 7A is shown in FIG. 7B.

The vertical axis in FIG. 7B indicates the current (A) flowing in the access transistor 6 and storage element 5; the horizontal axis indicates the voltage (V) applied to the access transistor 6 and storage element 5.

The solid line in FIG. 7B indicates the actual current-voltage characteristic when the access transistor 6 is in the ON state, and the dashed line indicates the load characteristic of resistance of the storage element 5 after information has been written. The minimum voltage (threshold voltage) necessary when erasing information is indicated by Vt. Point O indicates the operating point at point O in FIG. 7A.

In the state in which the gate voltage Von (Vg) to turn on the access transistor 6 is applied to the gate G of the access transistor 6, if the drain current flowing in the access transistor 6 for a voltage V (source-drain voltage) applied across the source S and drain D of the access transistor 6 is represented by $\{I(Vg,V)\}$, then the drain current flowing in the access transistor 6 is indicated by $I(Vg,Ve-Vt)$.

Here, in the state in which the gate voltage Von (Vg) to turn on the access transistor 6 is applied to the gate G of the access transistor 6, when for example a voltage Ve is applied to the storage element 2 to erase previously written information, a voltage Vt is applied to the storage element 5 and a voltage Ve−Vt is applied to the access transistor 6, on either side of the point O.

From FIG. 7A, the load characteristic of the resistance R at the point O at which the dashed and solid lines intersect is given by the following equation (1).

$$R = Vt/\{I(Vg, Ve-Vt)\} \tag{1}$$

Here, in order to determine the lower limit Rlow to the resistance value R of the storage element 5 after information has been written, as described above, a voltage equal to or greater than the minimum voltage Vt necessary for erasure of previously written information must be applied to the storage element 5.

Hence in this embodiment, the resistance R (minimum value Rlow of the resistance R) of the storage element 5 after information is written is expressed by the following equation (2).

$$R \geq Vt/\{I(Vg, Ve-Vt)\} \tag{2}$$

In a storage device 1 of this embodiment, the resistance value R (minimum value Rlow of the resistance R) of the storage element 5 after information is written is provided to satisfy the relation of equation (2), and so the various conditions (Ve, Vt, Vg, $\{I(Vg,Ve-Vt)\}$ and similar) of recording operation are provided so as to satisfy the relation (2), so that the resistance value R of the storage element 5 does not fall lower than is necessary.

Accordingly, when erasing previously written information, there is no longer a need to supply a large current to the storage element 5 through the access transistor 6.

Figure 12:
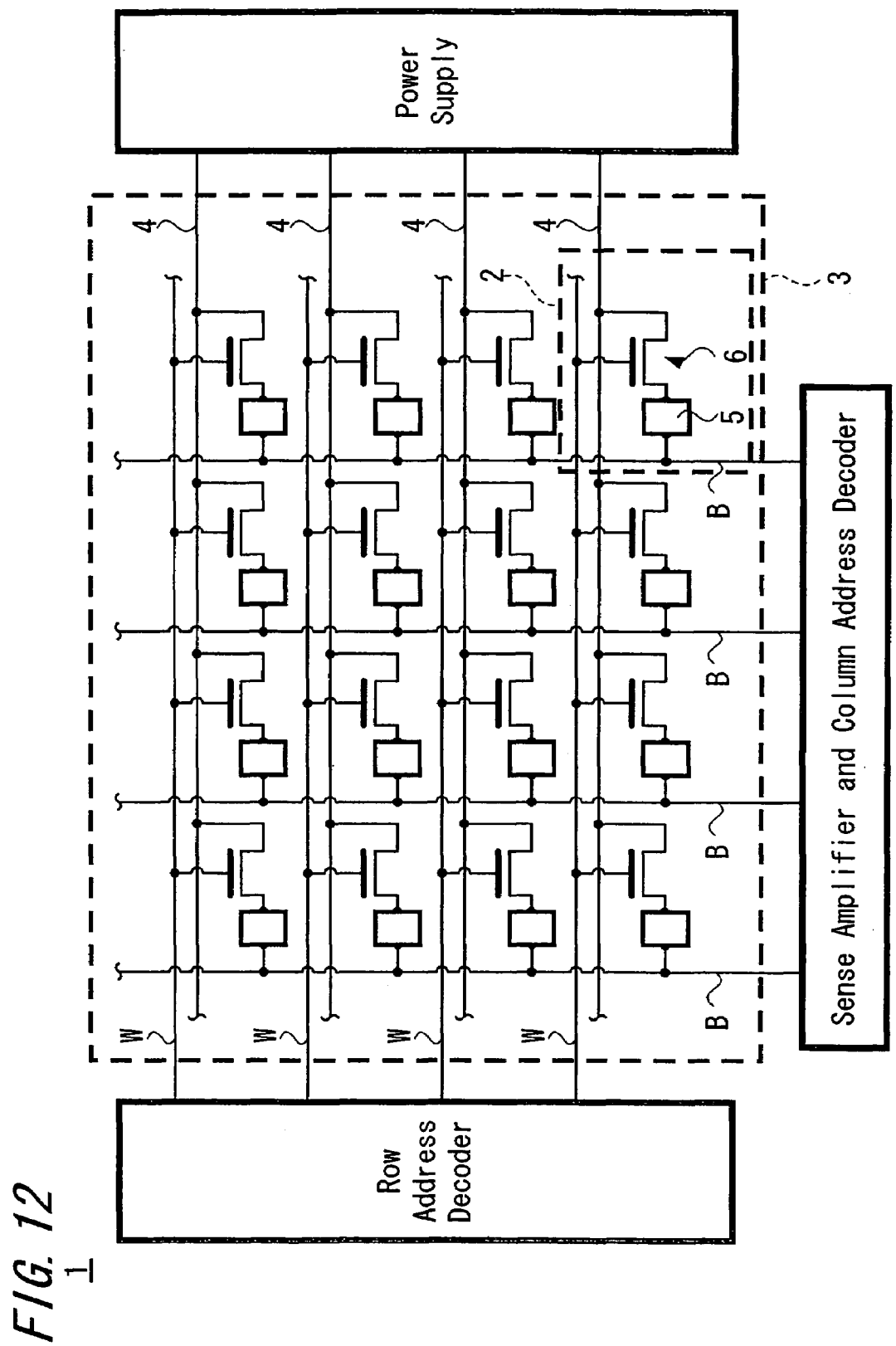
FIG. 12 shows a (first) plane view of another circuit configuration of a storage cell array of the storage device of FIG. 4.

The resistance value R provided by equation (2) is for the case of a so-called source-grounded circuit, in which, as shown in FIGS. 4, 5 and 7A, the access transistor 6 is positioned on the ground voltage side (bit line) and the storage element 5 is positioned on the power supply voltage side (power supply line 4); however, the resistance value R can be similarly provided by equation (2) in the case of a so-called drain-grounded circuit opposite to the above configuration, in which as shown in FIG. 12 below the access transistor 6 is positioned on the power supply voltage side (power supply line 4), and the storage element 5 is positioned on the ground voltage side (bit line).

Next, another embodiment of a storage device of this invention is explained in conjunction with FIG. 8.

Specifically, in this case the resistance value R (minimum value Rlow of the resistance R) of a storage element after information has been written is provided in terms of the transistor current capacity, as described by the ITRS (International Technology Roadmap for Semiconductors).

That is, in transistors (MOS transistors) used as the access transistor 6, while gate lengths continue to be made shorter, the channel widths have not been decreased so much as the gate lengths, due to the difficulty in suppressing narrow-channel effects of transistors.

For example, in transistors with a design rule in the 130 nm generation, even at the minimum design rule the channel width in a transistor is approximately 200 nm. The current capacity of such a transistor is substantially equal to the current capacity of a transistor described by the ITRS roadmap, and is understood to be a transistor of standard capacity as a semiconductor device.

According to the ITRS roadmap, it has been announced that even if for example design rules shrink from the 130 nm generation to a 70 nm generation between 2001 and 2006, the current capacities of transistors will continue to be substantially equal to the current capacities of transistors in the generation with a power supply voltage of 1.2 V and design rule of 130 nm. This current capacity is, as stated above, approximately 600 µA per micrometer of channel width.

Hence in this embodiment, as the access transistor 6 in the storage device 1 shown in FIG. 4, it is assumed that a transistor (MOS-type transistor) of a power supply voltage of 1.2 V and in the 130 nm design rule generation, with the smallest channel width in this generation (200 nm), is used, and the resistance value R (minimum value Rlow of the resistance R) of the storage element 5 after information has been written is provided.

Figure 8A:
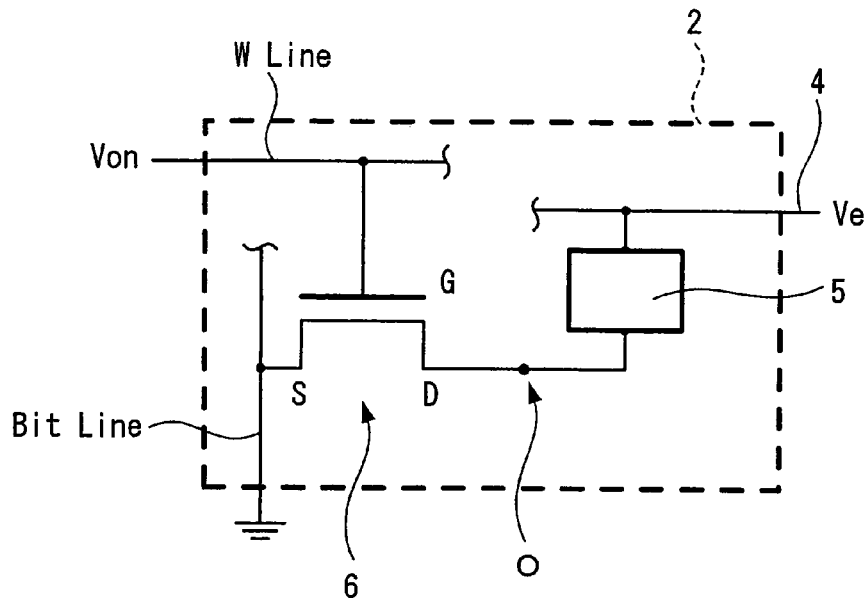
FIG. 8A is an enlarged plane view showing the state of a storage cell.
Figure 8B:
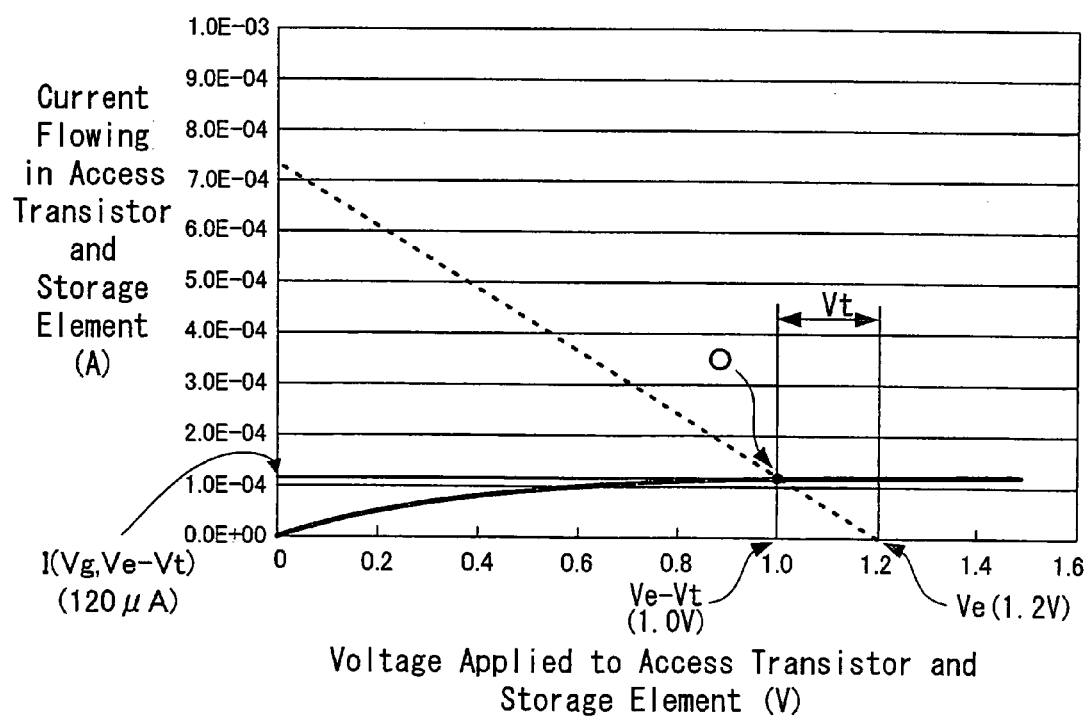
FIG. 8B is a graph showing the load characteristic of the resistance of a storage element and access transistor in the state shown in FIG. 8A.

In FIGS. 8A and 8B, the state in which a voltage Ve for erasure is applied to a storage cell 2 in which a storage element 5 and access transistor 6 are connected in series, a voltage Von (gate voltage Vg) is applied to the gate G of the access transistor 6 to turn on the access transistor 6, and the bit line B is grounded is shown in FIG. 8A, and the load characteristic of the storage element 5 and access transistor 6 in the state of FIG. 8A is shown in FIG. 8B.

When, in the state in which the gate voltage Von (Vg) to turn on the access transistor 6 is applied to the gate G of the access transistor 6, a voltage Ve (1.2 V) is applied to the storage element 2 in order to erase previously written information, the voltage Vt (0.2 V) is applied on the side of the storage element 5 and the voltage Ve−Vt (1.0 V) is applied to the access transistor 6, on either side of point 0.

Also, when a source-drain voltage Ve−Vt of 1.0 V is applied across the source S and drain D of the access transistor 6, a drain current I(Vt,Ve−Vt) of 120 µA flows in the access transistor 6.

The 120 µA drain current flowing in the access transistor 6 is, as described above, the drain current which flows when a transistor with a current capacity of approximately 600 µA, and a channel width of 0.2 µm (200 nm), is used as the access transistor 6.

Upon substituting these values into the above equation (2) to determine the resistance value R (minimum value Rlow of the resistance R) of a storage element after information writing, the following equation (3) is obtained.

$$R \geq 1.7\ k\Omega \qquad (3)$$

Equation (3) indicates that, when assuming that a transistor (MOS-type transistor) with a power supply voltage of 1.2 V and design rule in the 130 nm generation is used as the access transistor 6 in the storage device 1 of this embodiment, the resistance value of the storage element 5 after information has been written must be 1.7 kΩ or higher.

In the storage device 1 of this embodiment, when a transistor (MOS-type transistor) with power supply voltage of 1.2 V and in the 130 nm design rule generation is used as the access transistor, the resistance value R of a storage element after information is written is provided to satisfy the relation of equation (3), and so the resistance value R of a storage element after information has been written does not become lower than is necessary.

As a result, when for example previously written information is erased, there is no longer a need to supply a large current to the storage element 5 through the access transistor 6.

The resistance value R provided by equation (3) is, as indicated in FIGS. 4, 5 and 8A, for the case of a so-called source-grounded circuit, in which the access transistor 6 is positioned on the ground voltage side (bit line) and the storage element 5 is positioned on the power supply voltage side (power supply line 4); however, the resistance value R can be similarly provided by equation (3) in the case of a so-called drain-grounded circuit opposite to the above configuration, in which as shown in FIG. 12 below the access transistor 6 is positioned on the power supply voltage side (power supply line 4), and the storage element 5 is positioned on the ground voltage side (bit line).

Figure 9:
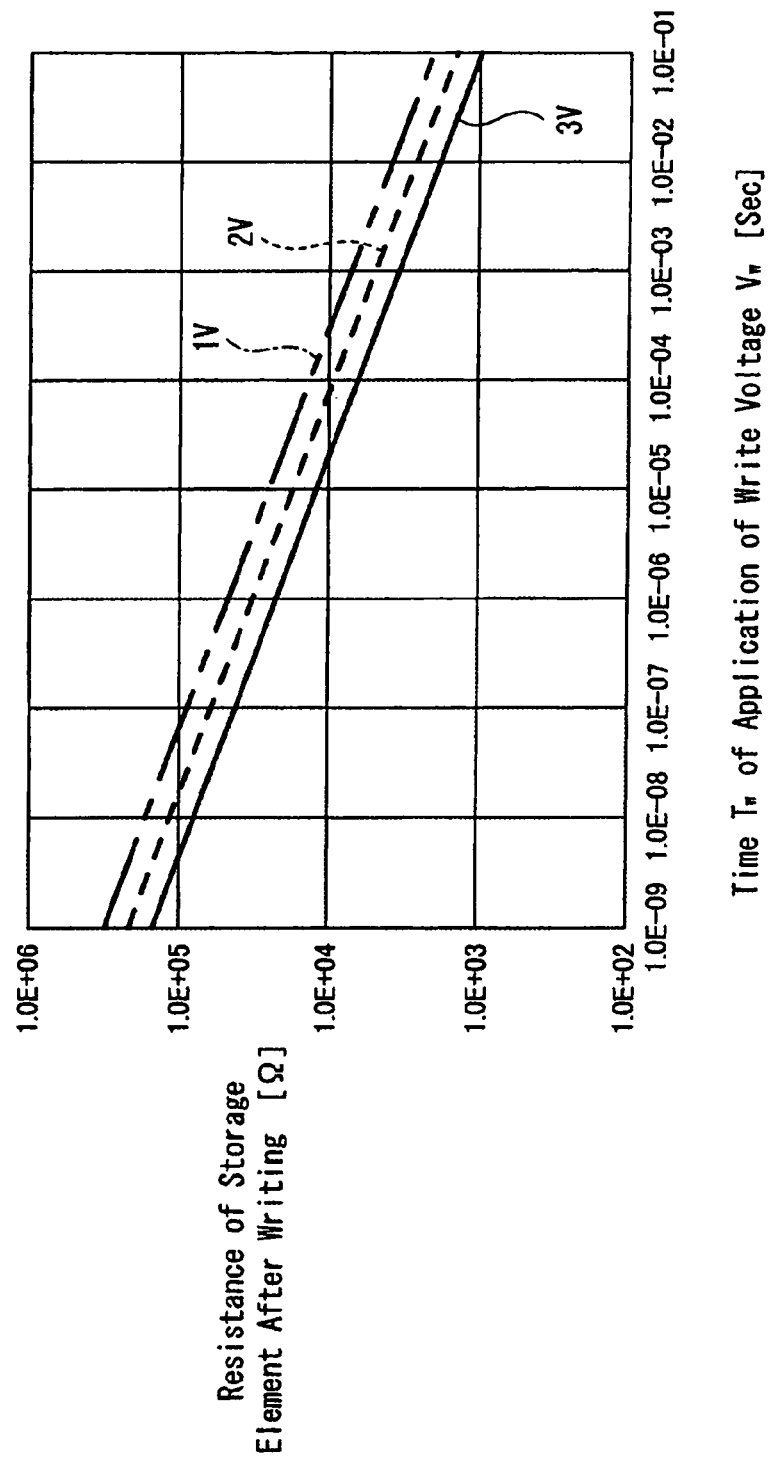
FIG. 9 is a graph showing the relation between resistance value and voltage application time.

Next, another embodiment of a storage device of this invention is explained referring to FIG. 9.

Specifically, in this case the resistance value R (minimum value Rlow of the resistance R) of a storage element 5 after information has been written is provided in terms of the voltage Vw applied to the storage cell 2 when writing information and the time Tw over which the voltage Vw is applied to the storage cell 2.

In FIG. 9, the vertical axis indicates the resistance R of a storage element after information has been written, and the horizontal axis indicates the time Tw (sec) over which the voltage Vw (V) is applied to the storage cell 2.

As the voltage Vw (V) applied to the storage cell 2, the highest voltage withstood by the storage cell in use, 3 V, was assumed, and the cases of 1 V and 2 V are also shown. In the graph, the solid line represents 3 V, the dashed line represents 2 V, and the dot-dash line represents 1 V.

From FIG. 9 it is seen that when information is written, as the time Tw (sec) over which the voltage Vw (V) is applied to the storage cell 2 is lengthened, the resistance R of the storage element 5 after information writing declines.

From this relation the resistance value R (minimum value Rlow of the resistance R) of a storage element 5 after information has been written can be determined as indicated by equation (4) below.

$$R = 10^{\{-0.275 \cdot \log(Tw) + 3.175 - 0.15 \cdot (Vw)\}} \qquad (4)$$

As explained above, the resistance value R of a storage element 5 after information has been written is expressed by equation (2) below.

$$R \geq Vt / \{I(Vg, Ve - Vt)\} \qquad (2)$$

The specific explanations of Ve, Vt, (Ve−Vt), Vg, and {I(Vg,Ve−Vt)} are as described above, and redundant explanations are omitted.

In this embodiment, in order that the resistance R (minimum value Rlow of the resistance R) of a storage element 5 after information has been written can be provided in terms of the voltage Vw (V) applied to a storage cell 2 when writing information and the time Tw (sec) over which the voltage Vw (V) is applied to the storage cell 2, the resistance value R (minimum value Rlow of the resistance R) is expressed by equation (5) below.

$$R = 10^{\{-0.275 \cdot log(Tw) + 3.175 - 0.15 \cdot (Vw)\}} \geq Vt/\{I(Vg, Ve-Vt)\} \quad (5)$$

In other words, when for example the specific values for all conditions other than the time Tw of application of the voltage Vw to the storage cell 2 are known (Vw, Vt, Vg, {I(Vg,Ve−Vt)}, by substitution of these values into equation (5), the above-described time Tw can be determined such that the resistance value R of a storage element 5 after information has been written satisfies a relation requiring that the resistance not be lower than necessary.

Also, when for example the specific values for all conditions other than the voltage Vw applied to the storage cell 2 are known (Tw, Vt, Vg, {I(Vg,Ve−Vt)}, by substitution of these values into equation (5), the above-described voltage Vw can be determined such that the resistance value R of a storage element 5 after information has been written satisfies a relation requiring that the resistance not be lower than necessary.

According to the storage device 1 of this embodiment, the resistance value R (minimum value Rlow of the resistance R) of a storage element 5 after information has been written is provided to satisfy the relation of equation (5), so that compared with the embodiments described above in which the resistance value R (minimum value Rlow of the resistance R) is provided to satisfy equation (1) and is provided to satisfy equation (3), the resistance value R (minimum value Rlow of the resistance R) of a storage element 5 after information has been written can be provided, including the voltage Vw applied to the storage cell 2 to which information is to be written and the time Tw of application of the voltage Vw to the storage cell 2.

Further, even in cases when the specific value of only one parameter (for example, Vw) is known among the voltage Vw applied to the storage cell 2 when writing is performed and the time Tw of application of the voltage Vw to the storage cell 2, from equation (5) the specific value of the other parameter (for example, Tw) can be calculated so as to satisfy the condition that the resistance value R of the storage element 5 after information has been written does not become lower than necessary.

Also, similarly to the cases of the above-described embodiments, when erasing previously written information, there is no longer a need to supply a large current to the storage element 5 through the access transistor 6.

The resistance value R provided by equation (5) is, as indicated in FIGS. 4 and 5, for the case of a so-called source-grounded circuit, in which the access transistor 6 is positioned on the ground voltage side (bit line) and the storage element 5 is positioned on the power supply voltage side (power supply line 4); however, the resistance value R can be similarly provided by equation (5) in the case of a so-called drain-grounded circuit opposite to the above configuration, in which as shown in FIG. 12 below the access transistor 6 is positioned on the power supply voltage side (power supply line 4), and the storage element 5 is positioned on the ground voltage side (bit line).

Next, still another embodiment of a storage device of the present invention is explained.

Specifically, the resistance value R (minimum value Rlow of the resistance R) of a storage element after information has been written is provided in terms of the current capacity of the transistor, as indicated by the ITRS, and in terms of the voltage Vw (V) applied to the storage cell when writing information and the time Tw (sec) over which this voltage Vw (V) is applied.

In the above embodiment, when assuming that a transistor (MOS-type transistor) with a power supply voltage of 1.2 V and in the 130 nm design rule generation is used as the access transistor 6 in the storage device shown in FIG. 4, the resistance value R of a storage element 5 after information has been written is as indicated by equation (3).

$$R \geq 1.7 \text{ k}\Omega \quad (3)$$

On the other hand, in the above-described embodiment, when the time Tw (sec) shown in FIG. 9 of application of the voltage Vw (V) to a storage cell 2 when writing information becomes long, due to the relation to the decline in resistance of the storage element 5 after information has been written, the resistance value R of the storage element 5 after information has been written is as shown in equation (4).

$$R = 10^{\{-0.275 \cdot log(Tw) + 3.175 - 0.15 \cdot (Vw)\}} \quad (4)$$

Hence, in this embodiment, in order that the resistance value R (minimum value Rlow of the resistance R) of a storage element after information has been written can be provided in terms of the transistor current capacity indicated by ITRS, or in terms of the voltage Vw (V) applied to a storage cell when writing information and the time Tw (sec) over which the voltage Vw (V) is applied, the resistance value R (minimum value Rlow of the resistance R) is expressed by the following equation (6).

$$R = 10^{\{-0.275 \cdot log(Tw) + 3.175 - 0.15 \cdot (Vw)\}} \geq 17000 \quad (6)$$

Equation (6) indicates that in the storage device 1 of this embodiment, when assuming that a transistor (MOS-type transistor) with a power supply voltage of 1.2 V and in the 130 nm design rule generation is used as the access transistor 6, the resistance value R (minimum value Rlow of the resistance R) of a storage element 5 after information has been written must be equal to or greater than 17000 (1.7 kΩ).

In a storage device 1 having such configuration, the various conditions (Tw and Vw) are provided such that the minimum value of the resistance R (Rlow) of a storage element 5 after information has been written is 17000 (1.7 kΩ) or higher, so that the resistance value R of a storage element 5 after information has been written does not become lower than 17000 (1.7 kΩ).

Next, an example satisfying this equation (6) is explained below.

When for example information is written, if the voltage Vw applied to the storage cell 2 is 2 V, from the equation (6) the time Tw of application of the voltage Vw to the storage cell 2 is calculated to be 51 msec or less.

That is, in a storage device 1 with the above-described configuration, if a voltage Vw of 2 V is applied to a storage cell 2 when writing information, in order that the resistance value R of the storage element 5 after information has been written is not lower than 17000 (1.7 kΩ), the time Tw of application of the voltage Vw to the storage cell 2 must be 51 msec or less.

Further, if when writing information the voltage Vw applied to the storage cell 2 is 3 V, from equation (6) the time Tw of application of the voltage Vw to the storage cell 2 is calculated to be 14 msec or less.

That is, in a storage device 1 with the above-described configuration, if a voltage Vw of 3 V is applied to a storage cell 2 when writing information, in order that the resistance value R of the storage element 5 after information has been written is not lower than 17000 (1.7 kΩ), the time Tw of application of the voltage Vw to the storage cell 2 must be 14 msec or less.

In the above, the case in which the time Tw over which a voltage Vw is applied to a storage cell 2 can be calculated when a specific value (2 V or 3 V) for the voltage Vw applied to a storage cell 2 is provided was explained; however, cases in which for example a specific value is provided for the time Tw over which a voltage Vw is applied to a storage cell 2, and the voltage Vw to be applied to the storage cell 2 is to be calculated, are also conceivable.

Cases in which the voltage Vw applied to the storage cell 2 is 2 V and 3 V were described; but any voltage Vw can be used which results in a change in the resistance value upon application to a storage element 5, and moreover which does not cause breakdown of the storage element 5 or access transistor 6, and need not be limited to 2 V or 3 V.

In the storage device 1 of this embodiment, the resistance value R (minimum value Rlow of the resistance R) of the storage element 5 after information has been written is provided so as to satisfy the relation of equation (6); however, similarly to the above-described embodiment in which the resistance value R (minimum value Rlow of the resistance R) is provided to satisfy the relation of equation (5), the resistance value R (minimum value Rlow of the resistance R) can be provided in terms of the voltage Vw applied to a storage element 5 when writing information and the time Tw of application of the voltage Vw to the storage cell 2.

Further, even in cases when the specific value of only one parameter (for example, Vw) is known among the voltage Vw applied to the storage cell 2 when writing is performed and the time Tw of application of the voltage Vw to the storage cell 2, from equation (6) the specific value of the other parameter (for example, Tw) can be calculated so as to satisfy the condition that the resistance value R of the storage element 5 after information has been written does not become lower than 17000 (1.7 kΩ).

Also, similarly to the above-described embodiment, when for example erasing previously written information, there is no longer a need to supply a large current to the storage element 5 through the access transistor 6.

The resistance value R provided by equation (5) is, as indicated in FIGS. 4 and 5, for the case of a so-called source-grounded circuit, in which the access transistor 6 is positioned on the ground voltage side (bit line) and the storage element 5 is positioned on the power supply voltage side (power supply line 4); however, the resistance value R can be similarly provided by equation (5) in the case of a so-called drain-grounded circuit opposite to the above configuration, in which as shown in FIG. 12 below the access transistor 6 is positioned on the power supply voltage side (power supply line 4), and the storage element 5 is positioned on the ground voltage side (bit line).

The above description provides various embodiments in which the resistance value R, that is, the minimum value Rlow of the resistance R, of a storage element 5 after information has been written is provided.

The relation between the time Tw of application of a voltage Vw to a storage cell 2 when writing information to the resistance value R of the storage element 5 after the information has been written was shown in FIG. 9. From FIG. 9, it is seen that the time for the resistance R of the storage element 5 after information has been written to reach the target resistance (that is, the time Tw of application of the voltage Vw) depends on the magnitude of the voltage Vw.

In this regard, when recording information, by increasing the voltage Vw applied to the storage cell 2, the target resistance R can be obtained in a shorter length of time.

Hence in the following embodiment, by raising the voltage Vw applied to a storage cell 2, the resistance value R of the storage element 5 after information is written is changed to the target resistance in a short amount of time.

First, in order to facilitate understanding of this embodiment, the configuration of a conventional storage device (for example DRAM) is explained.

In conventional storage devices (for example DRAM), when a transistor (MOS-type transistor) with for example a power supply voltage of 1.2 V and in the 130 nm design rule generation is used as the access transistor, the voltage Vw applied to a storage cell when recording information is conventionally a voltage (for example 1.0 V) which is substantially equal to the power supply voltage (1.2 V) applied to the access transistors, sense amplifier and other peripheral circuitry.

However, in the storage device 1 of this embodiment, similarly to the case of the above-described conventional storage device (for example DRAM), when a transistor (MOS-type transistor) with for example a power supply voltage of 1.2 V and in the 130 nm design rule generation is used as the access transistor 6, a configuration is employed in which the voltage Vw applied to a storage cell 2 when writing information is not a voltage (for example 1.0 V) substantially equal to the power supply voltage applied to the access transistors, sense amplifier and other peripheral circuitry as in the above-described conventional storage devices, but instead a voltage (such as for example 2.0 V or 3.0 V) higher than the power supply voltage (1.2 V) is applied to the storage cell 2.

Thus in a storage device 1 of this embodiment, when writing information a voltage Vw (for example 2 V or 3 V) higher than the power supply voltage (1.2 V) applied to the access transistors 6, sense amplifier and other peripheral circuitry is applied to a storage cell 2, so that to the extent that a higher voltage Vw is applied, the resistance value R of the storage element after information writing changes to the target resistance R in a shorter length of time. In this regard, information writing can be performed in a shorter amount of time.

In a storage device 1 of this embodiment, a configuration is employed in which the voltage Vw applied to a storage element 5 is higher than the power supply voltage applied to the access transistors, sense amplifier and other peripheral circuitry; however, a configuration is also possible in which for example a voltage higher than the standard operating voltage of the access transistor 6 is applied to the storage element 5.

In this case also, as described above, to the extent that the voltage applied for writing is high, the resistance R of the storage element 5 after information is written will change to the target resistance R in a shorter length of time.

In cases where information recording is performed not by applying a write voltage Vw, as in the storage device 1 of this embodiment, but by supplying a write current, the terminal voltage of the storage element 5, which rises due to injection of this current, is higher than the power supply voltage applied to the address decoder, sense amplifier and other peripheral circuitry of the storage device 1.

And in cases where such a current is used also, a voltage higher than the standard operating voltage of the access transistor is applied to the storage element 5.

In the sense amplifier of a storage device (for example DRAM), there are cases in which the voltage is raised in order to apply a high voltage to a gate electrode of a certain portion of the peripheral circuitry. In such cases the voltage Vw applied to a storage cell 2 is made higher than the power supply voltage applied to the address decoder and sense amplifier in particular, for which voltages are not raised.

When the voltage Vw applied to a storage cell 2 when writing information is thus made higher than the power supply voltage applied to the access transistors 6, sense amplifier and other peripheral circuitry, and information is written, the problem of breakdown of the storage element 5 is conceivable.

Hence in the embodiment described below, when as explained above the voltage Vw applied to a storage cell 2 when writing information is made higher than the power supply voltage applied to access transistors 6, the sense amplifier and other peripheral circuitry, or is made higher than the standard operating voltage of the access transistors 6, the resistance value of the storage element 5 after information has been written is provided such that breakdown of the storage element 5 does not occur.

Figure 10A:
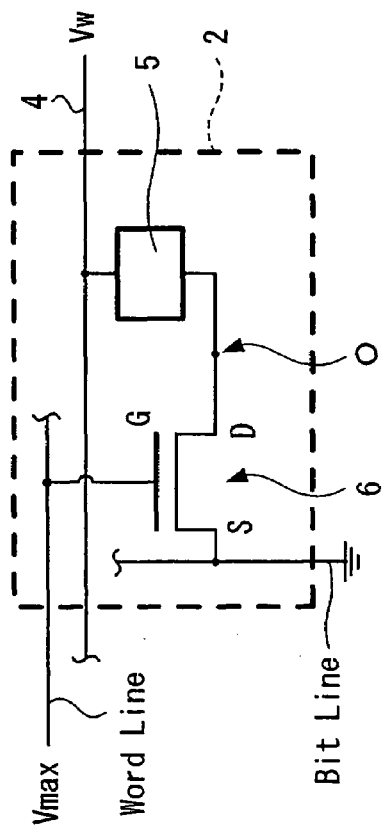
FIG. 10A is an enlarged plane view showing the state of a storage cell.
Figure 10B:
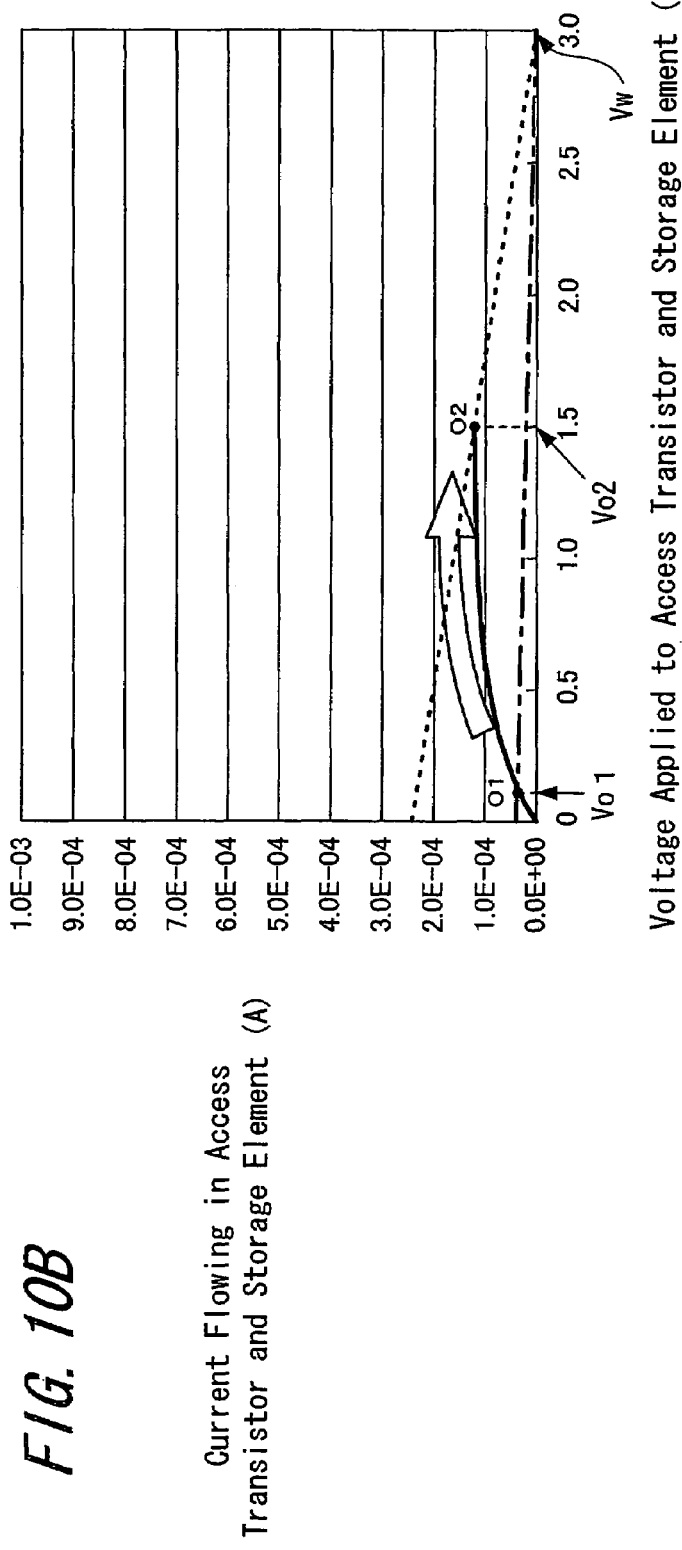
FIG. 10B is a graph showing the load characteristic of the resistance of a storage element and access transistor in the state shown in FIG. 10A.

To explain this embodiment, first the causes of breakdown of a storage element 5 are explained using FIGS. 10A and 10B.

In FIGS. 10A and 10B, a state in which a write voltage Vw is applied to a storage cell 2 in which a storage element 5 and access transistor 6 are connected in series, the maximum rated voltage Vmax is applied to the gate G of the access transistor 6, and the bit line B is grounded is shown in FIG. 10A, and the load characteristic of the storage element 5 and access transistor 6 in the state shown in FIG. 10A is shown in FIG. 10B.

Here the vertical axis in FIG. 10B indicates the current (A) flowing in the access transistor 6 and storage element 5, and the horizontal axis indicates the voltage (V) applied to the access transistor 6 and storage element 5.

The solid line in the graph indicates the current-voltage characteristic in the state in which the access transistor 6 is turned on, the dashed line indicates the load characteristic of the storage element 5 when in the low-resistance state due to information writing, and the dot-dash line indicates the load characteristic of the storage element 5 when in the high-resistance state prior to information writing.

The current-voltage characteristic in the state in which the access transistor 6 is on extends to 1.5 V, which is the maximum rated source-drain voltage. Also, the point O in FIG. 10A corresponds to the operating point at O1 or O2 in FIG. 10B.

The maximum rated value indicates the magnitude of the current at which punch-through or parasitic bipolar operation occur in the access transistor 6, or at which a current larger than the current normally expected begins to flow, or at which there is breakdown of the access transistor due to the large current being passed, or at which other unexpected operation occurs.

In FIGS. 10A and 10B, when the resistance value of a storage element prior to writing of information is for example 100 kΩ, if a voltage Vw of 3.0 V is applied to the storage cell 2, the current flowing is 30 μA. The dot-dash line indicates the load characteristic for this state.

When a storage element 5 in this state and an access transistor 6 are connected in series, the operating point is indicated by the position of intersection O1 of the load characteristic represented by the dot-dash line, and the current-voltage characteristic of the access transistor 6, represented by the solid line.

When at this time a voltage Vo1 is applied at the point of intersection O1 to the access transistor 6, a voltage (Vw−Vo1) is applied to the storage element. Hence when the write voltage Vw (3.0 V) is applied to the storage cell 2, most of this voltage is applied to the storage element 5.

Here, if the write voltage Vw (3.0 V) continues to be applied, the resistance value of the storage element 5 declines. This is accompanied by an increase in the absolute value of the slope of the load characteristic of the resistance of the storage element 5.

The operating point of the storage cell 2 at the time the source-drain voltage of the access transistor 6 reaches the maximum rated value (1.5 V) is indicated by the point of intersection O2 of the dotted line representing the load characteristic of the storage element 5, and the solid line representing the current-voltage characteristic of the access transistor 6. The voltage Vo2 at this point of intersection O2 is equal to the maximum rated value of the access transistor 6.

In this state also, when the voltage Vw (3.0 V) is applied continuously to the storage cell 2, the resistance of the storage element 5 continues to fall. In this case, a voltage higher than the maximum rated source-drain voltage is applied to the access transistor 6, so that breakdown of the access transistor 6 and storage element 5, and also of connected wiring and insulating film surrounding these components occurs.

Hence in this embodiment, the resistance R of a storage element after information has been written is provided to satisfy equation (7).

$$R \geq (Vw - Vo2)/Ivo2 \qquad (7)$$

As described above, Vw is the voltage applied to a storage cell 2 when writing information, Vo2 is the maximum rated value of the source-drain voltage of the access transistor 6, and (Ivo2) is the drain current flowing when the access transistor 6 is turned on and the source-drain voltage is Vo2.

In a storage device 1 of this embodiment, the resistance value R of a storage element after information has been written is provided so as to satisfy the relation of equation (7), so that in a configuration in which a voltage higher than the power supply voltage applied to the access transistors 6, sense amplifier and other peripheral circuitry is applied to the storage element 5, or in a configuration in which a voltage higher than the standard operating voltage of the access transistor 6 is applied to the storage element 5, the resistance value of the storage element 5 after writing can be prevented from falling lower than is necessary, and application of a voltage equal to or higher than the maximum rated source-drain voltage of the access transistor 6 can be prevented.

As a result, breakdown of the access transistor 6 and storage element 5, and also of connected wiring and insulating film surrounding these components, can be prevented.

In this embodiment, a configuration can also be employed in which, in each memory cell constituting the storage device 1, the gate length of an access transistor 6 is longer than the gate lengths of transistors other than access transistors 6.

In such a case, the maximum rated value of the source-drain voltage of the access transistor 6 can be made large.

As a result, compared with cases in which the gate length of the access transistor 6 is shorter than the gate lengths of transistors other than access transistors 6 (or when the gate lengths are equal), the resistance value when the maximum rated value of the source-drain voltage is applied to an access transistor 6 becomes lower.

Hence the tolerance of the resistance value R of a storage element 5 after information has been written can be expanded.

In this embodiment, when the standard operating voltage of the access transistors 6 or of the transistors in peripheral circuitry having the same gate length as the access transistors 6 is Vo3, the resistance R of a storage element 5 after information has been written can be provided to satisfy the following equation (8).

$$R \geq (V_w - V_{o3})/(IV_{o3}) \tag{8}$$

Vw denotes the voltage applied to a storage cell 2 when writing information, Vo3 denotes the standard operating voltage of an access transistor 6 or of a transistor in the peripheral circuitry having the same gate length as an access transistor 6, and (IVo3) denotes the drain current flowing when the access transistor 6 is in the ON state and the source-drain voltage is Vo3.

In the storage device 1 of this embodiment, the resistance R of a storage element after information writing is provided to satisfy the relation of equation (8), and so in a configuration in which the voltage applied to a storage element 5 is higher than the power supply voltage applied to an access transistor 6 or to the sense amplifier or other peripheral circuitry, and in a configuration in which the voltage applied to a storage element 5 is higher than the standard operating voltage of an access transistor 6, the application to an access transistor 6 of a voltage equal to or higher than the maximum rated value of the source-drain voltage can be prevented, and breakdown of an access transistor 6 or storage element 5, and also of connected wiring and of insulating film surrounding these components, can be prevented.

Further, the access transistor 6 can be made to operate at a voltage below the standard operating voltage (recommended operating power supply voltage) determined when the access transistor 6 was designed, so that for example the degradation of characteristics of the transistor which occurs upon repeated use of the access transistor 6 can be suppressed.

Accordingly, deterioration of the transistor reliability can be prevented.

Next, still another embodiment of a storage device of the present invention is explained.

Specifically, in the above-described configuration in which the voltage applied to a storage element is higher than the power supply voltage applied to an access transistor 6, sense amplifier or other peripheral circuitry, or in an embodiment in which a voltage higher than the standard operating voltage of the access transistor 6 is applied, when writing information the resistance value R of a storage element after information has been written is provided, including conditions for the voltage Vw applied to the storage cell 2, the time Tw over which the voltage Vw is applied to the storage cell 2, and also the maximum rated voltage Vo2 of the access transistor 6 and similar.

In the above-described equation (4), the resistance R (minimum value Rlow of the resistance R) of a storage element 5 after information has been written is expressed as follows.

$$R = 10^{\{-0.275 \cdot \log(T_w) + 3.175 - 0.15 \cdot (V_w)\}} \tag{4}$$

Further, in the above-described equation (7), the resistance R of a storage element after information has been written is expressed as follows.

$$R \geq (V_w - V_{o2})/(IV_{o2}) \tag{7}$$

In this embodiment, the resistance R of a storage element 5 after information has been written is provided to satisfy the following equation (9), derived from equations (4) and (7).

$$R = 10^{\{-0.275 \cdot \log(T_w) + 3.175 - 0.15 \cdot (V_w)\}} \geq (V_w - V_{o2})/(IV_{o2}) \tag{9}$$

Here, an example which satisfies this equation (9) is explained.

If for example the maximum rated value Vo2 of the source-drain voltage of an access transistor 6 is 1.5 V, and the drain current IVo2 with the access transistor 6 in the ON state and the source-drain voltage being Vo2 is 120 mA, when writing information if the voltage Vw applied to the storage cell 2 is 2 V, then the time Tw over which the voltage Vw is applied to the storage cell 2 is calculated to be 1.9 msec or less (Tw≦1.9 msec).

In this regard, if under the above conditions writing is performed for 1.9 msec or less, then a voltage equal to or greater than the maximum rated source-drain voltage is not applied to the access transistor 6, and there is no breakdown of the access transistor 6.

When for example the maximum rated value Vo2 of the source-drain voltage of an access transistor 6 is 1.5 V, the access transistor is in the ON state, and the drain current IVo2 flowing when the source-drain voltage is Vo2 is 120 mA, when information is written the time Tw over which the voltage Vw is applied to the storage cell 2 is expressed by for example 10 $\mu$sec (Tw≦10 $\mu$sec). If writing is performed in 10 $\mu$sec or less under the above conditions, a voltage exceeding the maximum rated value of the source-drain voltage is not applied to the access transistor 6, and breakdown of the access transistor 6 does not occur.

As described above, in the storage device of this embodiment, the resistance value R of the storage element 5 after information has been written is provided to satisfy the relation of equation (9), the resistance value R can be provided including the conditions of the voltage Vw applied to the storage element 5 when writing information, the time Tw over which the voltage Vw is applied to the storage cell 2, the maximum rated voltage Vo2 of the access transistor 6, and the like.

Similarly to the cases of the above-described embodiments, in a configuration in which the voltage applied to the storage element 5 is higher than the power supply voltage applied to the access transistors 6, sense amplifier or other peripheral circuitry, or in a configuration in which the voltage applied is higher than the standard operating voltage of the access transistor 6, the resistance value R of the storage element 5 after writing does not fall lower than is necessary, and application of a voltage equal to or exceeding the maximum rated value of the source-drain voltage of the access transistor 6 can be prevented.

Accordingly, breakdown of the access transistor 6 and storage element 5, and also of connected wiring and of insulating film surrounding these components, can be prevented.

A case has been explained in which, when specific values are provided for the voltage Vw applied to the storage cell 2 upon writing information and the resistance R of the storage element 5 after information has been written, the time Tw of application of the voltage Vw to the storage cell 2 is calculated; however, when for example specific values are provided for the time Tw of application of the voltage Vw to the storage element 2 and the resistance R of the storage element 5 after information has been written, the voltage Vw applied to the storage cell 2 can be calculated as well.

Also, in this embodiment, similarly to embodiments described above, the gate length of the access transistor 6 in each of the memory cells constituting the storage device 1 can be made longer than the gate lengths of transistors other than the access transistor 6.

As described above, in this case the maximum rated value of the source-drain voltage of the access transistor 6 can be increased, and compared with cases in which the gate length of the access transistor 6 is shorter than (or equal to) the gate lengths of transistors other than access transistors 6, the resistance value when the maximum rated value of the source-drain voltage is applied to the access transistor 6 is lower.

Hence the tolerance of the resistance R of a storage element 5 after information writing can be expanded.

In this embodiment, the following configuration can also be employed.

Specifically, in the configuration described above in which the voltage applied to a storage element is higher than the power supply voltage applied to the access transistors 6, sense amplifier and other peripheral circuitry, and in an embodiment in which the voltage applied is higher than the standard operating voltage of the access transistor 6, the resistance value R of a storage element 5 after information has been written is provided, including conditions for the voltage Vw applied to the storage cell 2 when information writing is performed, the time Tw of application of the voltage Vw to the storage cell 2, and the standard operating voltage Vo3 of the access transistor 6 or of transistors of the peripheral circuitry having the same gate length as the access transistor 6.

In the above-described equation (4), the resistance value R (minimum value Rlow of the resistance) of a storage element 5 after information has been written is expressed as follows.

$$R = 10^{\{-0.275 \cdot log(Tw) + 3.175 - 0.15 \cdot (Vw)\}}$$

Further, in the above-described equation (8), the resistance value R of a storage element after information has been written is expressed as follows.

$$R \geq (Vw - Vo3)/(IVo3) \quad (8)$$

Then, in this embodiment, the resistance R of a storage element 5 after information has been written is provided to satisfy the following equation (10), derived from equations (4) and (8).

$$R = 10^{\{-0.275 \cdot log(Tw) + 3.175 - 0.15 \cdot (Vw)\}} \geq (Vw - Vo3)/(IVo3) \quad (10)$$

Thus in the storage device 1 of this embodiment the resistance value R of the storage element 5 after information writing is provided to satisfy the relation of equation (10), so that the resistance value R of a storage element 5 after information has been written can be provided in terms of the voltage Vw applied to the storage element 5 when writing information, the time Tw of application of the voltage Vw to the storage cell 2, also the standard operating voltage Vo3 of the access transistor 6 and of transistors of the peripheral circuitry having the same gate length as access transistors 6 and the like.

Similarly to the case of the embodiment in which the resistance R of a storage element 5 after information writing is provided to satisfy the relation of equation (9), in a configuration in which the voltage applied to a storage element 5 is higher than the power supply voltage applied to the access transistors 6, sense amplifier or other peripheral circuitry, or in a configuration in which the voltage applied is higher than the standard operating voltage of the access transistor 6, the application of a voltage exceeding the maximum rated value of the source-drain voltage to an access transistor 6 can be prevented, and breakdown of the access transistor 6 and storage element 5, and also of connected wiring and of insulating film surrounding these components, can be prevented.

Further, by operating an access transistor 6 at or below the standard operating voltage determined at the time of design of the access transistor 6, that is, at or below the recommended operating voltage, degradation of the transistor characteristics which occurs upon repeated use of the active transistor 6 can be suppressed.

In this way, deterioration of the transistor reliability can be prevented.

The above description provides various embodiments in which, by raising the voltage Vw applied to a storage cell 2, the resistance value R of the storage element 5 after information has been written can be changed to the target resistance value in a short length of time.

As described above, if the resistance value of a storage element after information has been written is higher than is necessary, the time required to read the information written to the storage element of an arbitrary storage cell is lengthened. This means that the storage device no longer operates at the required operating frequency.

Hence in the following embodiment, an upper limit Rhigh to the resistance value R of a storage element 5 after information has been written is provided, in order to prevent the resistance R of a storage element after information writing from becoming such that a long time is required for reading.

The upper limit Rhigh of the resistance value R of a storage element 5 after information has been written is provided assuming that the storage device 1 is for example used together with a system LSI within consumer electronic equipment such as a portable telephone set.

Here, the operating frequency of the system LSI used within the portable telephone set is assumed to be, for example, 20 MHz to 40 MHz. In this regard, the storage device 1 is required to have an operating frequency of at least 20 MHz.

First, the characteristics required when reading information (read characteristics) recorded in the storage element 5 of an arbitrary storage cell 2 in a conventional storage device (for example, DRAM) are described.

Figure 11:
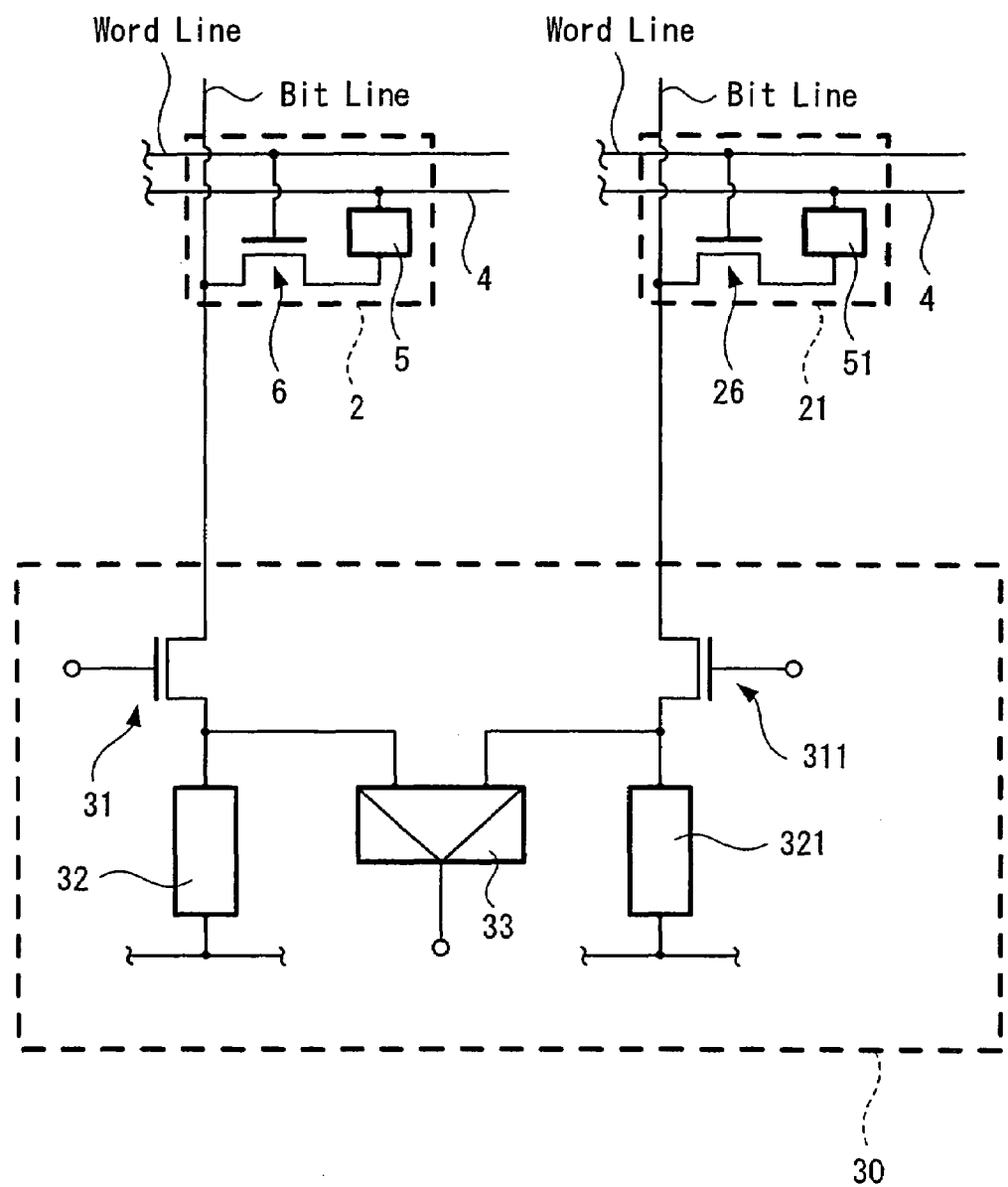
FIG. 11 shows the configuration of the read circuit of a storage device.

These read characteristics are explained together with the configuration of a read circuit 30 shown in FIG. 11.

The read circuit 30 is configured with, for example, transistors for control (switching transistors) 31, 311 provided near the entrance, load circuits 32, 321 which convert the current flowing in a bit line (cell current) into a voltage, and a sense amplifier 33 to detect information written to the storage elements 5, 51 of each storage cell 2, 21, connected by wiring, where the information is written to the storage elements 5, 51 by executing control through access transistors 6, 26.

The storage cell 21 provided on the right side in the drawing is a so-called reference cell used to compare the states of cell currents flowing in the bit lines when reading information which has been written to the storage element 5 of the storage cell 2 provided on the left side in the drawing.

Other portions are similar to those in the storage device 1 shown in FIG. 4, and so the same symbols are assigned to corresponding portions.

The ratio Rsensing, which is the fraction of the cycle time Tc occupied by the time Tsensing from the end of accessing of an arbitrary storage cell 2 and the beginning of the change in state of the bit line on which reading is performed until the end of detection of the state by the sense amplifier 33, is approximately 50%.

If the time from the beginning of change of the current flowing in the bit line to be read, or in the potential into which the current flowing in the bit line on which reading is performed is converted by the load circuit 32 until the steady state is reached (that is, the time required for the change in state of the bit line) is Tfull, and the time from the beginning of the change until the beginning of detection (that is, the time spent waiting for a change in the bit line state) is Twait, then the ratio of Twait to Tfull is approximately 50%. In a conventional storage device, the current flowing in a bit line, or the voltage resulting from conversion of this current, is detected during 50% of the time until the steady state is reached, without waiting for the end of the state change in the bit line.

Further, the ratio Rwait 2 of the above-described time Twait over which a change in the bit line state is awaited to the time Tsensing from the end of accessing of an arbitrary storage cell 2 and the beginning of the change in state of a bit line to be read until detection of the state ends is approximately 50%. Of the above-described time Tsensing, in the remaining time Tsns processing is performed to detect the bit line current, or to detect the voltage resulting from conversion of this current.

These relations may be summarized as follows.

Time required for one reading cycle: Tc

Time Twait over which a change in the bit line state is awaited: 25% of Tc, and 50% of Tfull Time Tsns for detection of the bit line current or voltage: 25% of Tc Processing other than this: 50% of Tc (for example, processing to access the storage cell 2 for reading, processing to output the read information, processing to return the state of the bit line in which the voltage has changed due to reading to the potential prior to reading, and similar)

In the storage device 1 of this embodiment, similarly to conventional storage devices, in order to operate at an operating frequency of at least 20 MHz, that is, with a cycle time of 50 nsec, the time Twait over which a change in the bit line state is awaited, which occupies 25% of the cycle time Tc, must be 12.5 nsec or less.

Considering also that, as explained above, the time Twait over which a change in the bit line state is awaited is equal to 50% of the time Tfull required for a change in the bit line state, in order to operate the storage device at a cycle time of 50 nsec, the time Tfull required for a change in bit line state must be 25 nsec or less.

Next, based on these relations, the time constant is calculated for state changes in the read line (bit line) occurring when reading information written to the storage element 5 of an arbitrary storage cell 2.

In the storage device 1 of this embodiment, when for example the read circuit 30 shown in FIG. 11 is configured, the resistance Rtotal over the read line (bit line) in which current is flowing is expressed by the following equation (11).

$$Rtotal = Rm + Roa + Rosw + Rload \quad (11)$$

Rm is the resistance value of the storage element 5 of the storage cell 2; Roa is the resistance in the ON state of the access transistor 6 of the storage cell 2; Rosw is the resistance in the ON state of the switching transistor 31 provided in the read circuit 30; and Rload is the resistance of the load circuit 32.

Here the storage element 5 is assumed to be configured such that, when for example information is being written, by controlling the write conditions, a low-resistance state can be created which is an intermediate state of the change in resistance.

In other words, as described above, if the resistance of a storage element 5 which has not been written is for example 100 kΩ, then by controlling the write conditions, low-resistance states of, for example, 50 kΩ, 20 kΩ, and 10 kΩ can be created.

In the state in which the 100 kΩ storage element 5 holds the data "00", the resistance value at this time is taken to be Rmhigh; in the state in which the 50 kΩ storage element 5 holds the data "01", the resistance value at this time is taken to be Rmlowl; in the state in which the 20 kΩ storage element 5 holds the data "10", the resistance value at this time is taken to be Rmlow2; and in the state in which the 10 kΩ storage element 5 holds the data "11", the resistance value at this time is taken to be Rmlow3.

On considering a read operation when the data "00" is held, that is, when the storage element 5 is in the high-resistance state Rmhigh, as explained above, the current (cell current) flowing in the bit line B from the power supply 4 to the storage element 5 is detected as being either "extremely small" or "zero" by the sense amplifier 33 in the read circuit 30.

Hence by performing a read operation, if the current flowing in the bit line B can be regarded as either "extremely small" or "zero", then the resistance of the storage element 5 is judged to be in the high-resistance state.

In this way, reading of a state in which data "00" is held is comparatively simple, and there is little possibility of erroneous reading of a data value held other than "00".

On the other hand, when for example a storage element 5 is in the state of holding data "01" (that is, when the resistance of the storage element 5 is in the next-lower resistance state compared with the high-resistance state), upon reading the information held, the magnitude of the current (cell current) flowing in the bit line B from the power supply line 4 through the storage element 5 is judged to be either larger or smaller than the current for the above-described state of holding data "00".

Alternatively, for purposes of contrast, a judgment can be made as to whether the above cell current is equal to, for example, the current (cell current) flowing in the bit line B from the power supply line 4 through the storage element 51 of a reference cell 21 to which data "01" has been written.

In order to make the judgment accurately, it is necessary to wait for a certain length of time before detecting the change in current in bit line B, or before detecting the change in voltage when for example current/voltage conversion is performed in the load circuit 321.

As explained above, it is more difficult to read information when, in a storage element 5, data "01" is held and the resistance is in a low-resistance state (Rmlow1), compared with when data "00" is held and the resistance is in the high-resistance state (Rmhigh).

In other words, reading is more difficult when the resistance of a storage element 5 to which information has been written is low.

Thus when the resistance of a storage element 5 is in the Rmlow1 state, the resistance value Rtotal across the read line (bit line) in which current is flowing is expressed by the following equation (12).

$$R\text{total} = R\text{mlow1} + R\text{oa} + R\text{osw} + R\text{load} \tag{12}$$

On the other hand, if the magnitude of the parasitic capacitance associated with the read line (bit line) when reading information from the storage element 5 of an arbitrary storage cell 2 is Cp, then the time constant in the storage cell 2 is expressed by the following equation (13).

$$Tx = Cp \cdot R\text{total} \tag{13}$$

As explained above, in order to operate the storage device 1 at an operating frequency of 20 MHz or higher, that is, at a cycle time of 50 nsec, the time constant Tx (that is, the above-described time Tfull required for a change in state in the bit line) must be held to less than 25 nsec.

This condition may be expressed by the following equation (14).

$$Cp \cdot R\text{total} \leq 25 \text{ nsec} \tag{14}$$

In an ordinary storage device (for example DRAM), the capacitance of a storage cell is approximately 20 fF (femtofarads), whereas the magnitude of the parasitic capacitance associated with a read line (for example a bit line) when reading information recorded in the storage element of an arbitrary storage cell is approximately 100 fF.

Hence in this embodiment, when the resistance of a storage element 5 is in the Rmlow1 state, by making the resistance Rtotal over the read line (bit line) in which current is flowing satisfy the following equation (15), the storage device 1 can be operated at an operating frequency of 20 MHz or higher, that is, with a cycle time of 50 nsec.

$$R\text{total} \leq 250 \text{ k}\Omega \tag{15}$$

In the equation (15), as with equation (12), of the four resistance components (Rmlow1, Roa, Rosw, Rload) constituting the resistance Rtotal over the read line (bit line) in which current flows, Roa and Rosw are small in magnitude, and so are assumed to be negligible.

Hence in order to enable operation of the storage device 1 at an operating frequency of 20 MHz or higher, that is, with a cycle time of 50 nsec, the resistance R (upper limit Rhigh of the resistance R) of a storage element after information has been written is expressed by equation (16).

$$R + R\text{load} \leq 250 \text{ k}\Omega \tag{16}$$

Here R is the resistance (Rmlow1) of the storage element 5 after information has been written.

In the storage device 1 of this embodiment, the resistance R (upper limit Rhigh of the resistance R) of a storage element 5 after information has been written is provided to satisfy the relation of equation (16), and so the resistance R of a storage element 5 after information has been written does not become higher than is necessary.

Further, this equation (16) assumes operation of the storage device 1 at an operating frequency of 20 MHz or higher (a cycle time of 50 nsec) to provide the resistance R; hence problems in the prior art, such as the slow charging of the parasitic capacitance associated with the bit line B due to the small current flowing in the bit line B through the storage element 35, as a result of which large delays occur in changes in the bit line potential, do not arise.

Consequently increases in the time required to read information can be prevented.

Next, still another embodiment of the storage device of this invention is explained.

In for example the configuration of the read circuit 20 shown in FIG. 11, when the resistance R (Rmlow1) of a storage element 5 after information has been written and the resistance Rload of the load circuit 32 are made equal, the voltage input to the sense amplifier 33 is one-half the power supply voltage, and so the amplification can be set higher. In addition, because a level-shift circuit to change the input voltage to approximately one-half the power supply voltage is unnecessary, the read circuit 30 can be simplified.

Hence in the storage device 1 of this embodiment, the resistance R (upper limit Rhigh of the resistance R) of a storage element 5 to which information has been written is expressed by the following equation (17).

$$R \leq 125 \text{ k}\Omega (= 250/2 \text{ k}\Omega) \tag{17}$$

Here, similarly to embodiments explained above, R represents the resistance (Rmlow1) of a storage element 5 after information has been written.

In the storage device 1 of this embodiment, by providing that the resistance R (upper limit Rhigh of the resistance R) of a storage element 5 after information has been written satisfy the relation of equation (17), similarly to the case of an embodiment described above, the resistance of the storage element 5 after information has been written does not become higher than is necessary.

Further, the resistance is provided assuming operation of the storage device 1 at an operating frequency of 20 MHz or higher (a cycle time of 50 nsec); hence problems in the prior art, such as the slow charging of the parasitic capacitance associated with the bit line B due to the small current flowing in the bit line B through the storage element 35, as a result of which large delays occur in changes in the bit line potential, do not arise.

Consequently increases in the time required to read information can be prevented.

Next, still another embodiment of the storage device of this invention is explained.

Specifically, in this case the resistance R, that is, the upper limit Rhigh of the resistance R, of a storage element 5 after information has been written is calculated from the relation between the voltage Vw applied to the storage cell 2 when writing information and the time Tw over which the voltage Vw is applied to the storage cell 2.

In other words, as explained above, the resistance R of a storage element 5 after information has been written is expressed by the following equation (4).

$$R = 10^{\{-0.275 \cdot \log(Tw) + 3.175 - 0.15 \cdot (Vw)\}}$$

On the other hand, as explained above, the resistance R of a storage element 5 after information has been written is also expressed by the following equation (17).

$$R \leq 125 \text{ k}\Omega \tag{17}$$

Hence in a storage device 1 of this embodiment, in order that the resistance R (upper limit Rhigh of the resistance R) of a storage element 5 after information has been written can be provided, including the voltage Vw (V) applied to a storage cell 2 when information is written and the time Tw (sec) of application of the voltage Vw, the resistance R (upper limit Rhigh of the resistance R) is expressed by the following equation (18).

$$R = 10^{\{-0.275 \cdot \log(Tw) + 3.175 - 0.15 \cdot (Vw)\}} \leq 125 \text{ k}\Omega \tag{18}$$

In other words, equation (18) means that in a storage device 1 of this embodiment, when assuming as an access transistor 6 the use of a transistor (MOS-type transistor) with a power supply voltage of 1.2 V and in the 130 nm design rule generation, the resistance R of a storage element 5 after information has been written, that is, the upper limit Rhigh of the resistance, must be 125 kΩ or less.

Further, in a storage device 1 with this configuration, by providing values for various conditions (Tw and Vw) such that the resistance R of a storage element 5 after information has been written is 125 kΩ or less to perform information recording operations, the resistance R of a storage element 5 after information has been written can be prevented from rising above 125 kΩ.

Next, a specific practice example satisfying this equation (18) is explained.

When for example information is being written, if the voltage Vw applied to the storage cell is 2 V, from equation (18) the time Tw of application of the voltage Vw to the storage cell 2 is calculated to be 8.3 nsec.

That is, when writing information to a storage element 5 in the storage device 1, if the voltage Vw applied to the storage cell 2 is 2 V, then in order that the resistance R of the storage element 5 after information has been written be 125 kΩ or less, the time Tw of application of the voltage Vw to the storage cell 2 must be 8.3 nsec or longer.

Further, when for example information is being written and the voltage Vw applied to the storage cell is 3 V, from equation (18), the time Tw of application of the voltage Vw to the storage cell 2 is calculated to be 2.4 nsec.

That is, when writing information to a storage element 5 in the storage device 1, if the voltage Vw applied to the storage cell 2 is 3 V, then in order that the resistance R of the storage element 5 after information has been written be 125 kΩ or less, the time Tw of application of the voltage Vw to the storage cell 2 must be 2.4 nsec or longer.

Thus the case has been explained in which, when a specific value (2 V or 3 V) is provided for the voltage Vw applied to the storage cell 2, the time Tw of application of the voltage Vw to the storage cell 2 is calculated; however, cases are also conceivable in which, when a specific value for the time Tw of application of the voltage Vw to the storage cell 2 is provided, the voltage Vw applied to the storage cell 2 is calculated.

As the voltage Vw applied to the storage cell 2, cases of 2 V and 3 V were described; however, the voltage Vw is not limited to 2 V or 3 V, but may be any voltage which when applied to a storage element 5 causes a change in resistance, and moreover does not cause breakdown of the storage element 5 or access transistor 6.

In the storage device 1 of this embodiment, the resistance R, that is, the upper limit Rhigh of the resistance of a storage element 5 after information has been written is provided to satisfy the relation of equation (18), so that the upper limit Rhigh of the resistance R of the storage element 5 after information has been written can be provided, including the voltage Vw applied to the storage element 5 when writing information and the time Tw of application of the voltage Vw to the storage cell 2.

Further, among the voltage Vw applied to the storage cell 2 and the time Tw of application of the voltage Vw to the storage cell 2 when writing information, even a specific value of only one parameter (for example Vw) is known, from equation (18) the specific value of the other parameter (for example Tw) can be calculated so as to satisfy the condition that the resistance R of the storage element 5 after information has been written not be higher than 125 kΩ.

Further, similarly to an embodiment described above, the resistance given by equation (18) is provided assuming operation of the storage device 1 at an operating frequency of 20 MHz or higher (a cycle time of 50 nsec); hence problems in the prior art, such as the slow charging of the parasitic capacitance associated with the bit line B due to the small current flowing in the bit line B through the storage element 35, as a result of which large delays occur in changes in the bit line potential, do not arise.

Consequently increases in the time required to read information can be prevented.

A case has been explained in which specific values are provided for the voltage Vw applied to a storage cell when writing information and the resistance R of the storage element after information has been written, and the time Tw of application of the voltage Vw to the storage cell is calculated; however, in cases where specific values are provided for the time of application Tw of the voltage Vw to the storage cell and the resistance R of the storage element after information has been written, the voltage Vw applied to the storage cell can be calculated.

The above description provides various embodiments in which the upper limit Rhigh of the resistance R of a storage element 5 after information has been written is provided.

In the above-described embodiments, explanations have been given to the example of a storage device 1 with storage cell array configured as shown in FIG. 4; however the configuration of the storage cell array is not limited to the configuration shown in FIG. 4.

For example, as shown in FIG. 12, in the storage cells 2 the gate G of the access transistor 6 is connected via wiring to the word line W; but a storage cell array 3 is also possible in which the storage element 5 may be connected to the bit line via wiring, and the access transistor 6 is connected to the power supply line 4 via wiring.

Figure 13:
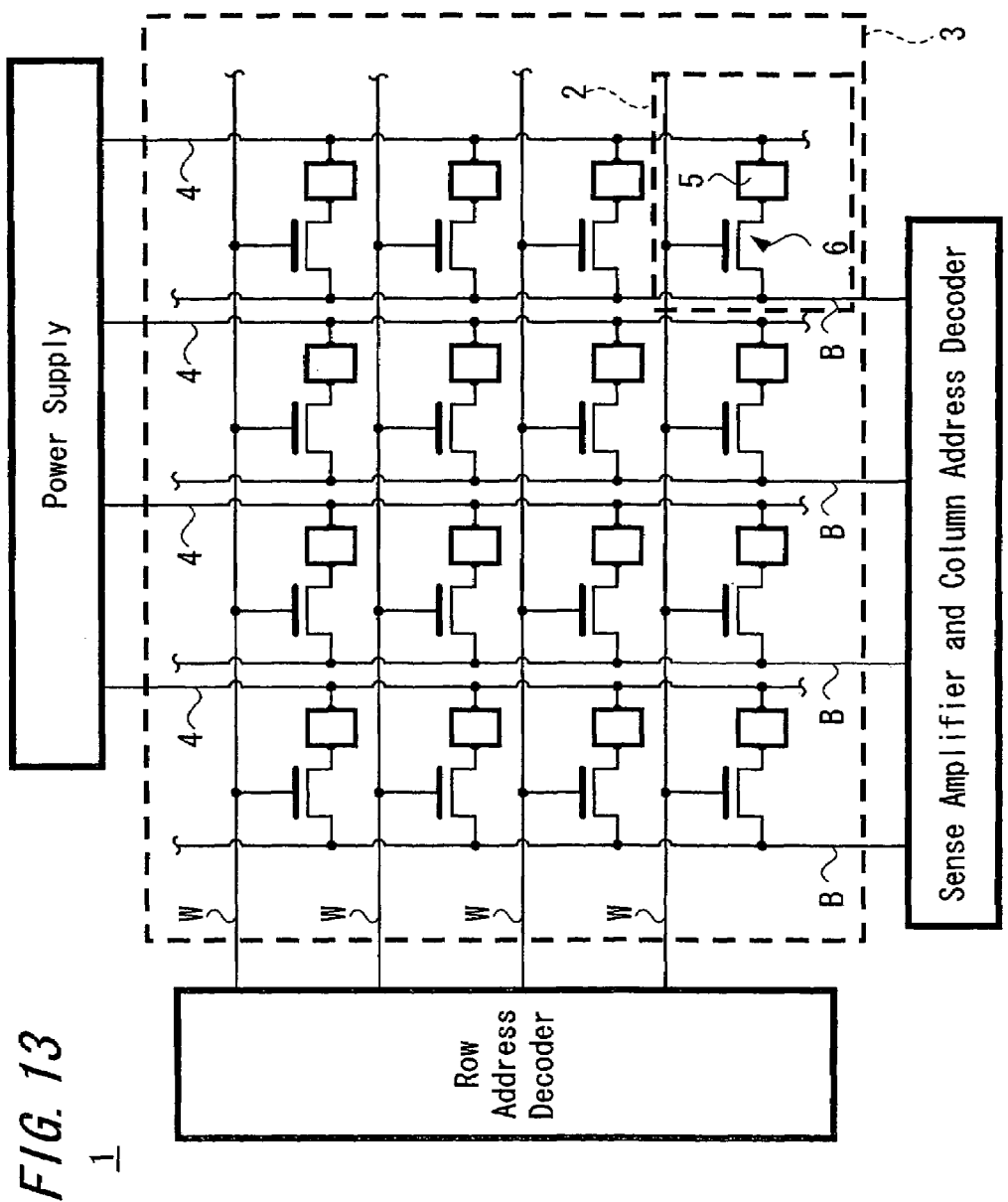
FIG. 13 shows a (second) plane view of another circuit configuration of a storage cell array of the storage device of FIG. 4.

Also, as shown in FIG. 13, in a storage cell 2 the gate G of the access transistor 6 is connected via wiring to the word line W, and the storage element 5 is connected to the power supply line 4 via wiring, as above; but the storage cell array 3 may also be configured with the power supply line connected parallel to the bit line B.

Figure 14A:
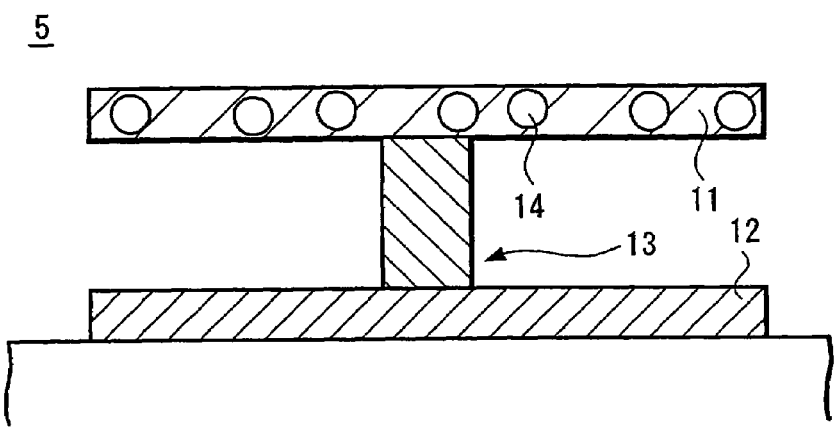
FIGS. 14A and 14B are enlarged cross-sectional views showing other configurations of the storage element of FIG. 6.
Figure 14B:
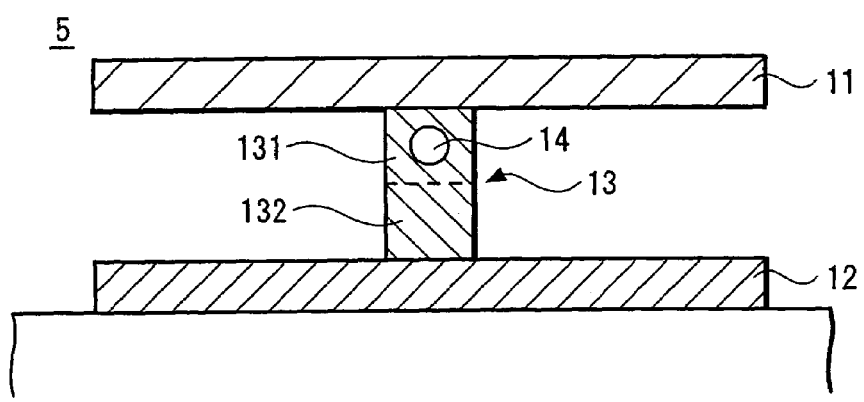

Further, in explanations of the above embodiments the storage element 5 has a two-layer construction of the intra-electrode material 13, as in FIG. 6; however, the intra-electrode material may have a single-layer construction, as for example in FIGS. 14A and 14B.

For example, the storage element 5 shown in FIG. 14A is structured with the first electrode 11 and second electrode 12 enclosing the intra-electrode material layer 13, and with the oxidation-reduction activation species (redox activator) 14 in solid solution or diffused within the first electrode 11.

Otherwise the structure is the same as in FIG. 6, and so corresponding portions are assigned the same symbols, and redundant explanations are omitted.

The storage element 5 shown in FIG. 14B is structured with the intra-electrode material layer 13 enclosed between for example two electrodes (for example a first electrode 11 and second electrode 12).

This intra-electrode material layer 13 has a two-layer structure, in which for example the oxidation-reduction activation species (redox activator) 14 is in solid solution or diffused within the intra-electrode material layer 131, and the redox activator 14 is not in solid solution or diffused within the intra-electrode material layer 132.

Otherwise the configuration is similar to that shown in FIG. 6, and so corresponding portions are assigned the same symbols, and redundant explanations are omitted.

The above-described recording operations are for cases in which a write voltage is applied to a bit line and a voltage lower than the write voltage (the ground voltage) is applied to the power supply line 4; however, this recording operation can be reversed. That is, the write voltage can be applied to the power supply line 4, and the ground voltage, lower than the write voltage, applied to the bit line.

In the above-described embodiments, cases were explained in which information is written to the storage element 5 of an arbitrary storage cell 2; however by appropriately modifying the voltage applied to each storage cell 2, information writing can be performed simultaneously to a plurality of storage cells 2.

In the above-described embodiments, when writing information to the storage element 5 of a storage cell 2 to which a voltage is applied, the control of an active element (access transistor) 6 or the like was explained; however, depending on the type of element and active element, cases are also conceivable in which a current is supplied and information is written to the storage element 5 of a storage cell 2. In such cases also, by controlling the active element (access transistor) 6, similar advantageous results can be obtained.

In the above-described embodiments, when reading information written to the storage element 5 of a storage cell 2, cases were explained in which a read circuit such as shown in FIG. 11 is used to read information; however, a plurality of other methods to read information written to the storage element 5 of a storage cell 2 are conceivable. For example, the storage element 5 of a storage cell 2 can be accessed similar to the operation to write information, and a voltage lower than the voltage used when writing information can be applied to the storage element 5 of the storage cell 2.

This invention is not limited to the above-described embodiments, and various other configurations which do not deviate from the scope of this invention are possible.

According to a storage device of the present invention in an embodiment, the resistance value of a storage element after information has been written is provided, so that the resistance value of the storage element after information has been written can be prevented from being lower or higher than is necessary.

Accordingly, erasure of previously written information can be performed easily, without the active element becoming large.

Further, delays in the time required to read information written to the storage element of an arbitrary storage cell, that is, delays in the read time, can be prevented, and the storage device can be made to operate at the required operating frequency.

Consequently, a storage device can be provided in which increases in the size of storage cells and in the size of the storage device can be prevented, and manufacturing costs can be held down.

Further, a storage device in which integration densities are increased can be provided.

Furthermore, according to a storage device of the present invention in an embodiment, the time for the resistance value of a storage element after information has been written to reach a target resistance value can be reduced, without causing breakdown of the storage element, active element, or similar.

Hence a storage device can be provided in which information recording operation times are reduced.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A storage device comprising a plurality of storage cells arranged and each having a storage element and an active element comprising a MOS transistor which controls access to said storage element, and in which, by applying a voltage to said storage element, a resistance value of said storage element changes and information is recorded;

wherein when recording operation to change the resistance value of said storage element from a high state to a low state is defined as information writing, and recording operation to change the resistance value of said storage element from a low state to a high state is defined as information erasure;

if when erasing said written information the voltage applied to said storage cell is Ve and a voltage applied to a gate of said active element is Vg, a minimum voltage necessary when erasing said information is Vt, and a drain current flowing in said active element for a voltage V across a source and drain of said active element when said active element is in an ON state is represented by a function $\{I(Vg,V)\}$, then a resistance value R of said storage element after said information has been written satisfies a relation:

$$R \geq Vt/\{I(Vg, Ve-Vt)\}.$$

2. A storage device comprising a plurality of storage cells arranged and each having a storage element and an active element comprising a MOS transistor which controls access to said storage element, and in which, by applying a voltage to said storage element, a resistance value of said storage element changes and information is recorded;

wherein when recording operation to change the resistance value of said storage element from a high state to a low state is defined as information writing, and recording operation to change the resistance value of said storage element from a low state to a high state is defined as information erasure, then;

the resistance value R of said storage element after said information is written satisfies a relation:

$$R \geq 1.7 \text{ k}\Omega.$$

3. A storage device comprising a plurality of storage cells arranged and each having a storage element and an active element comprising a MOS transistor which controls access to said storage element, and in which, by applying a voltage to said storage element, a resistance value of said storage element changes and information is recorded;

wherein when recording operation to change the resistance value of said storage element from a high state to a low state is defined as information writing, and recording operation to change the resistance value of said storage element from a low state to a high state is defined as information erasure;

if when writing said information the voltage applied to said storage cell is Vw (V) and the time over which said voltage is applied to said storage cell is Tw (sec), when erasing said written information the voltage applied to said storage cell is Ve (V), a voltage applied to a gate of said active element is Vg (V) and a minimum voltage necessary when erasing said information is Vt (V), and if with said active element in an ON state, a drain current flowing in said active element for a voltage V across a source and drain of said active element is represented by a function $\{I(Vg,V)\}$, then a relation:

$$10^{\{-0.275 \cdot \log(Tw) + 3.175 - 0.15 \cdot (Vw)\}} \geq Vt/\{I(Vg, Ve-Vt)\}$$

is satisfied.

4. A storage device comprising a plurality of storage cells arranged and each having a storage element and an active element comprising a MOS transistor which controls access to said storage element, and in which, by applying a voltage to said storage element, a resistance value of said storage element changes and information is recorded, wherein when recording operation to change the resistance value of said storage element from a high state to a low state is defined as information writing, and recording operation to change the resistance value of said storage element from a low state to a high state is defined as information erasure, if when writing said information the voltage applied to said storage cell is Vw (V) and the time over which said voltage is applied to said storage cell is Tw (sec), then a relation:

$$10^{\{-0.275 \cdot \log(Tw)+3.175-0.15 \cdot (Vw)\}} \geq 1700$$

is satisfied.

5. A storage device comprising a plurality of storage cells arranged and each having a storage element and an active element comprising a MOS transistor which controls access to said storage element, and in which, by applying a voltage to said storage element a resistance value of said storage element changes and information is recorded, and a load circuit that is used when said information is read from said storage elements is provided; wherein when recording operation to change the resistance value of said storage element from a high state to a low state is defined as information writing, and recording operation to change the resistance value of said storage element from a low state to a high state is defined as information erasure, if the resistance value of said storage element after information has been written is R and the resistance value of said load circuit is Rlo, then a relation:

$$R+Rlo \leq 250 \ k\Omega.$$

is satisfied.

6. A storage device comprising a plurality of storage cells arranged and each having a storage element and an active element comprising a MOS transistor which controls access to said storage element, and in which, by applying a voltage to said storage element, the resistance value of said storage element changes and information is recorded, wherein when recording operation to change the resistance value of said storage element from a high state to a low state is defined as information writing, and recording operation to change the resistance value of said storage element from a low state to a high state is defined as information erasure, a resistance R of said storage element after information has been written satisfies a relation:

$$R \leq 125 \ k\Omega.$$

7. A storage device comprising a plurality of storage cells arranged and each having a storage element and an active element comprising a MOS transistor which controls access to said storage element, and in which, by applying a voltage to said storage element, a resistance value of said storage element changes and information is recorded, wherein when recording operation to change the resistance value of said storage element from a high state to a low state is defined as information writing, and recording operation to change the resistance value of said storage element from a low state to a high state is defined as information erasure, if when writing said information the voltage applied to said storage cell is Vw (V) and a time over which said voltage is applied to said storage cell is Tw (sec), then a relation:

$$10^{\{-0.275 \cdot \log(Tw)+3.175-0.15 \cdot (Vw)\}} \leq 125000$$

is satisfied.

8. A storage device comprising a plurality of storage cells arranged and each having a storage element and an active element comprising a MOS transistor which controls access to said storage element, and in which, by applying a voltage to said storage element, the resistance value of said storage element changes and information is recorded, wherein when recording operation to change the resistance value of said storage element from a high state to a low state is defined as information writing, and recording operation to change the resistance value of said storage element from a low state to a high state is defined as information erasure, when writing said information said voltage applied to said storage cell is higher than a power supply voltage applied to peripheral circuitry, other than said storage cells, not subjected to increases in voltage, or is higher than a standard operating voltage of said active element.

9. The storage device according to claim 8, wherein when said information writing is performed, if the voltage applied to said storage cell is Vw, a maximum rated voltage of said active element is Vo2, and a drain current flowing in said active element is IVo2 when said active element is in an ON state and a voltage across a source and drain of said active element is Vo2, then a resistance R of said storage element after said information writing is performed satisfies a relation:

$$R \geq (Vw-Vo2)/IVo2.$$

10. The storage device according to claim 9, wherein a gate length of said active element of said storage cell is longer than a gate length of active elements other than in said storage cells.

11. The storage device according to claim 8, wherein when said information writing is performed, if the voltage applied to said storage cell is Vw, a standard operating voltage of said active element is Vo3, and a drain current flowing in said active element is IVo3 when said active element is in an ON state and a voltage across a source and drain of said active element is Vo3, then a resistance R of said storage element after said information writing is performed satisfies a relation:

$$R \geq (Vw-Vo3)/IVo3.$$

12. The storage device according to claim 8, wherein when said information writing is performed, if a time of application of said voltage to said storage cell is Tw (sec), a voltage applied to said storage cell is Vw (V), a maximum rated voltage of said active element is Vo2 (V), and a drain current flowing in said active element when said active element is in an ON state and a voltage across a source and drain of said active element is Vo2 (V) is IVo2 (A), then a relation:

$$10^{\{-0.275 \cdot \log(Tw)+3.175-0.15 \cdot (Vw)\}} \geq (Vw-Vo2)/IVo2$$

is satisfied.

13. The storage device according to claim 12, wherein a gate length of said active element of said storage cell is longer than a gate length of active elements other than in said storage cells.

14. The storage device according to claim 8, wherein when said information writing is performed, if a time of application of said voltage to said storage cell is Tw (sec), a voltage applied to said storage cell is Vw (V), a standard operating voltage of said active element is Vo3 (V), and a drain current flowing in said active element, when said active element is in an ON state and a voltage across a source and drain of said active element is Vo3 (V), is IVo3 (A), then a relation:

$$10^{\{-0.275 \cdot log(Tw) + 3.175 - 0.15 \cdot (Vw)\}} \geq (Vw - Vo3)/IVo3$$

is satisfied.

* * * * *